(12) United States Patent
Mun et al.

(10) Patent No.: US 12,255,259 B2
(45) Date of Patent: Mar. 18, 2025

(54) OPTICAL SENSOR INCLUDING PLANAR NANO-PHOTONIC MICROLENS ARRAY AND ELECTRONIC APPARATUS INCLUDING THE SAME

(71) Applicant: SAMSUNG ELECTRONICS CO., LTD., Suwon-si (KR)

(72) Inventors: Sangeun Mun, Seoul (KR); Junho Lee, Incheon (KR); Sookyoung Roh, Yongin-si (KR); Sungmo Ahn, Yongin-si (KR); Seokho Yun, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 395 days.

(21) Appl. No.: 17/701,019

(22) Filed: Mar. 22, 2022

(65) Prior Publication Data

US 2023/0020980 A1    Jan. 19, 2023

(30) Foreign Application Priority Data

Jul. 15, 2021    (KR) .......................... 10-2021-0093132

(51) Int. Cl.
*H01L 31/02*    (2006.01)
*H01L 27/146*    (2006.01)
(Continued)

(52) U.S. Cl.
CPC .. *H01L 31/02327* (2013.01); *H01L 27/14627* (2013.01); *H01L 31/02162* (2013.01)

(58) Field of Classification Search
CPC ......... H01L 31/02162; H01L 31/02321; H01L 27/14627
(Continued)

(56) References Cited

U.S. PATENT DOCUMENTS 7,667,286 B2    2/2010    Toshikiyo et al.
11,086,143 B1 *    8/2021    Gill .................... G02F 1/13471
(Continued)

FOREIGN PATENT DOCUMENTS

EP    1 785 750 A1    5/2007
EP    3812801 A *    4/2021    ....... H01L 27/14627
(Continued)

OTHER PUBLICATIONS

Communication dated Sep. 13, 2022, issued by the European Patent Office in counterpart European Application No. 22164826.4.
(Continued)

*Primary Examiner* — Phuc T Dang
(74) *Attorney, Agent, or Firm* — Sughrue Mion, PLLC

(57) ABSTRACT

An optical sensor including a planar nano-photonic microlens array and an electronic apparatus including the same are provided. The optical sensor may include: a sensor substrate including a plurality of photosensitive cells for sensing light; a filter layer provided on the sensor substrate; and a planar nano-photonic microlens array provided on the filter layer, and including a plurality of planar nano-photonic microlenses, wherein the plurality of planar nano-photonic microlenses are two-dimensionally arranged in a first direction and a second direction that is perpendicular to the first direction, and each of the planar nano-photonic microlenses include nano-structures arranged such that the light transmitting through each of the planar nano-photonic microlenses has a phase profile in which a phase change curve is convex in the first direction and the second direction.

18 Claims, 28 Drawing Sheets

(51) Int. Cl.
*H01L 31/0216* (2014.01)
*H01L 31/0232* (2014.01)

(58) Field of Classification Search
USPC .......................................................... 257/432
See application file for complete search history.

(56) References Cited

U.S. PATENT DOCUMENTS

| | | | |
|---|---|---|---|
| 2014/0313379 A1* | 10/2014 | Mackey | ............... H04N 25/133 |
| | | | 438/70 |
| 2021/0048342 A1 | 2/2021 | Kim et al. | |
| 2021/0125301 A1 | 4/2021 | Park et al. | |
| 2021/0126035 A1 | 4/2021 | Roh et al. | |
| 2022/0208822 A1 | 6/2022 | Yun et al. | |
| 2022/0344399 A1 | 10/2022 | Ahn et al. | |

FOREIGN PATENT DOCUMENTS

| | | |
|---|---|---|
| EP | 4 024 459 A1 | 7/2022 |
| JP | 4531843 B2 | 8/2010 |
| KR | 10-1772968 B1 | 8/2017 |
| KR | 10-2021-0049670 A | 5/2021 |
| KR | 10-2022-0147448 A | 11/2022 |
| WO | WO-2011096895 A1 * | 8/2011 ........... G02B 3/0087 |

OTHER PUBLICATIONS

Communication dated Nov. 22, 2022, issued by the Korean Intellectual Property Office in Korean Patent Application No. 10-2021-0093132.

* cited by examiner

FIG. 2B

| C | M | C | M | C | M | C | M |
|---|---|---|---|---|---|---|---|
| Y | G | Y | G | Y | G | Y | G |
| C | M | C | M | C | M | C | M |
| Y | G | Y | G | Y | G | Y | G |
| C | M | C | M | C | M | C | M |
| Y | G | Y | G | Y | G | Y | G |
| C | M | C | M | C | M | C | M |
| Y | G | Y | G | Y | G | Y | G |

FIG. 2C

| R | G | R | G | R | G | R | G |
|---|---|---|---|---|---|---|---|
| B | W | B | W | B | W | B | W |
| R | G | R | G | R | G | R | G |
| B | W | B | W | B | W | B | W |
| R | G | R | G | R | G | R | G |
| B | W | B | W | B | W | B | W |
| R | G | R | G | R | G | R | G |
| B | W | B | W | B | W | B | W |

[Security]

OPTICAL SENSOR INCLUDING PLANAR NANO-PHOTONIC MICROLENS ARRAY AND ELECTRONIC APPARATUS INCLUDING THE SAME

CROSS-REFERENCE TO RELATED APPLICATIONS

This application is based on and claims priority under 35 U.S.C. § 119 to Korean Patent Application No. 10-2021-0093132, filed on Jul. 15, 2021, in the Korean Intellectual Property Office, the disclosure of which is incorporated by reference herein in its entirety.

BACKGROUND

1. Field

Apparatuses and methods consistent with example embodiments relate to an optical sensor including a planar nano-photonic microlens array and an electronic apparatus including the same.

2. Description of the Related Art

With the miniaturization of an optical sensor, such as an image sensor or a spectroscopy sensor, and an image module, a chief ray angle (CRA) at an edge of an optical module has increased. When the CRA increases at the edge of the optical sensor, sensitivity of pixels located at the edge of the optical sensor decreases. Thus, edges of an image may become dark. Also, a processor that processes images having dark edges is burdened with additional complicated color processing operations for compensating for the dark edges, and therefore the speed of processing the images decreases.

SUMMARY

One or more example embodiments provide an optical sensor including a planar nano-photonic microlens array capable of changing an incident angle of incident light that is incident on an edge of an optical sensor with a large chief ray angle (CRA) to be close to a vertical angle, and an electronic apparatus including the optical sensor.

According to an example embodiment, there is provided an optical sensor including: a sensor substrate including a plurality of photosensitive cells; a filter layer provided on the sensor substrate, and including a plurality of filters, each of the plurality of filters being configured to selectively transmit light of a certain wavelength band; and a planar nano-photonic microlens array provided on the filter layer, and including a plurality of planar nano-photonic microlenses, each of the plurality of planar nano-photonic microlenses having a nano-pattern structure that condenses the light onto a corresponding photosensitive cell from among the plurality of photosensitive cells, wherein the plurality of planar nano-photonic microlenses are two-dimensionally arranged in a first direction and a second direction that is perpendicular to the first direction, and each of the planar nano-photonic microlenses include a plurality of nano-structures that are arranged such that the light transmitting through each of the planar nano-photonic microlenses has a phase profile in which a phase change curve is convex in the first direction and the second direction.

The phase profile of the light that has passed through a center portion of the planar nano-photonic microlens array has a symmetrical shape in the first direction and a symmetrical shape in the second direction.

The planar nano-photonic microlens arranged on a periphery portion of the planar nano-photonic microlens array is configured to condense the light onto a center portion of the corresponding photosensitive cell by deviating a proceeding direction of light that is obliquely incident on the planar nano-photonic microlens.

The phase profile of the light that has passed through the planar nano-photonic microlens arranged on the periphery portion of the planar nano-photonic microlens array corresponds to a combination of an inclined linear phase profile and a convex phase profile.

A slope in the first direction of the inclined linear phase profile of the light that has passed through the planar nano-photonic microlens increases as distance of an incident position of the light from the center portion of the planar nano-photonic microlens array increases in the first direction. A slope in the second direction of the inclined linear phase profile of the light that has passed through the planar nano-photonic microlens increases as the distance of the incident position of the light from the center portion of the planar nano-photonic microlens array increases in the second direction.

A slope in the first direction of the inclined linear phase profile of the light that has passed through the planar nano-photonic microlens is proportional to a sine value of an incident angle of the light incident on the planar nano-photonic microlens array in the first direction. A slope in the second direction of the inclined linear phase profile of the light that has passed through the planar nano-photonic microlens is proportional to a sine value of an incident angle of the light incident on the planar nano-photonic microlens array in the second direction.

A slope of the inclined linear phase profile of the light that has passed through the planar nano-photonic microlens is proportional to a reciprocal number of a wavelength of light that is transmitted through a filter corresponding to the planar nano-photonic microlens, from among the plurality of filters.

Boundaries among the plurality of planar nano-photonic microlenses match boundaries among the plurality of filters and boundaries among the plurality of photosensitive cells in an entire area of the optical sensor.

The sensor substrate may include a first photosensitive cell and a second photosensitive cell. The filter layer may include a first filter and a second filter, the first filter corresponding to the first photosensitive cell and transmitting the light of a first wavelength band, and the second filter corresponding to the second photosensitive cell and transmitting the light of a second wavelength band that is shorter than the first wavelength band. The planar nano-photonic microlens array may include a first planar nano-photonic microlens and a second planar nano-photonic microlens, the first planar nano-photonic microlens corresponding to the first filter and condensing the light onto the first photosensitive cell, and the second planar nano-photonic microlens corresponding to the second filter and condensing the light onto the second photosensitive cell.

The first photosensitive cell, the first filter, and the first planar nano-photonic microlens may be arranged to face one another in a third direction that is perpendicular to the first direction and the second direction. The second photosensitive cell, the second filter, and the second planar nano-photonic microlens may be arranged to face one another in the third direction.

The first planar nano-photonic microlens may be configured such that the light of the first wavelength band passing through the first filter is condensed onto a center portion of the first photosensitive cell. The second planar nano-photonic microlens may be configured such that the light of the second wavelength band passing through the second filter is condensed onto a center portion of the second photosensitive cell.

A focal distance of the first planar nano-photonic microlens with respect to the light of the first wavelength band may be equal to a focal distance of the second planar nano-photonic microlens with respect to the light of the second wavelength band.

The phase change curve of the phase profile of the light of the second wavelength band that has passed through the second planar nano-photonic microlens, may have a curvature greater than a curvature of the phase change curve of the phase profile of the light of the first wavelength band that has passed through the first planar nano-photonic microlens.

The phase profile of the light that has passed through the first and second planar nano-photonic microlenses arranged on a periphery portion of the planar nano-photonic microlens array may correspond to a combination of an inclined linear phase profile and a convex phase profile.

A slope in the first direction of the linear phase profile of the light that has passed through the first planar nano-photonic microlens is less than a slope in the first direction of the linear phase profile of the light that has passed through the second planar nano-photonic microlens that is adjacent to the first planar nano-photonic microlens.

The plurality of nano-structures in each of the planar nano-photonic microlenses may have a higher refractive index than a refractive index of non-nanostructures of the planar nano-photonic microlenses.

The plurality of nano-structures in the planar nano-photonic microlens arranged on a center portion of the planar nano-photonic microlens array may be symmetrically arranged in the first direction and the second direction.

The plurality of nano-structures have nano-post shapes or nano-lattice shapes.

Each of the plurality of nano-structures may include a first nano-structure and a second nano-structure provided on the first nano-structure.

According to an example embodiment, there is provided an electronic apparatus including: an optical sensor configured to convert an optical image into an electrical signal; and a processor configured to control the optical sensor and process the electrical signal generated by the optical sensor, wherein the optical sensor may include: a sensor substrate including a plurality of photosensitive cells; a filter layer provided on the sensor substrate, and including a plurality of filters, each of the plurality of filters being configured to selectively transmit light of a certain wavelength band; and a planar nano-photonic microlens array provided on the filter layer, and including a plurality of planar nano-photonic microlenses each of the plurality of planar nano-photonic microlenses having a nano-pattern structure that condenses the light onto a corresponding photosensitive cell from among the plurality of photosensitive cells. The plurality of planar nano-photonic microlenses may be two-dimensionally arranged in a first direction and a second direction that is perpendicular to the first direction. Each of the planar nano-photonic microlenses include a plurality of nano-structures that are arranged such that the light transmitting through each of the planar nano-photonic microlenses may have a phase profile in which a phase change curve is convex in the first direction and the second direction.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 2A to 2C are diagrams showing examples of various pixel arrangements of a pixel array of an optical sensor;

DETAILED DESCRIPTION

Figure 1:
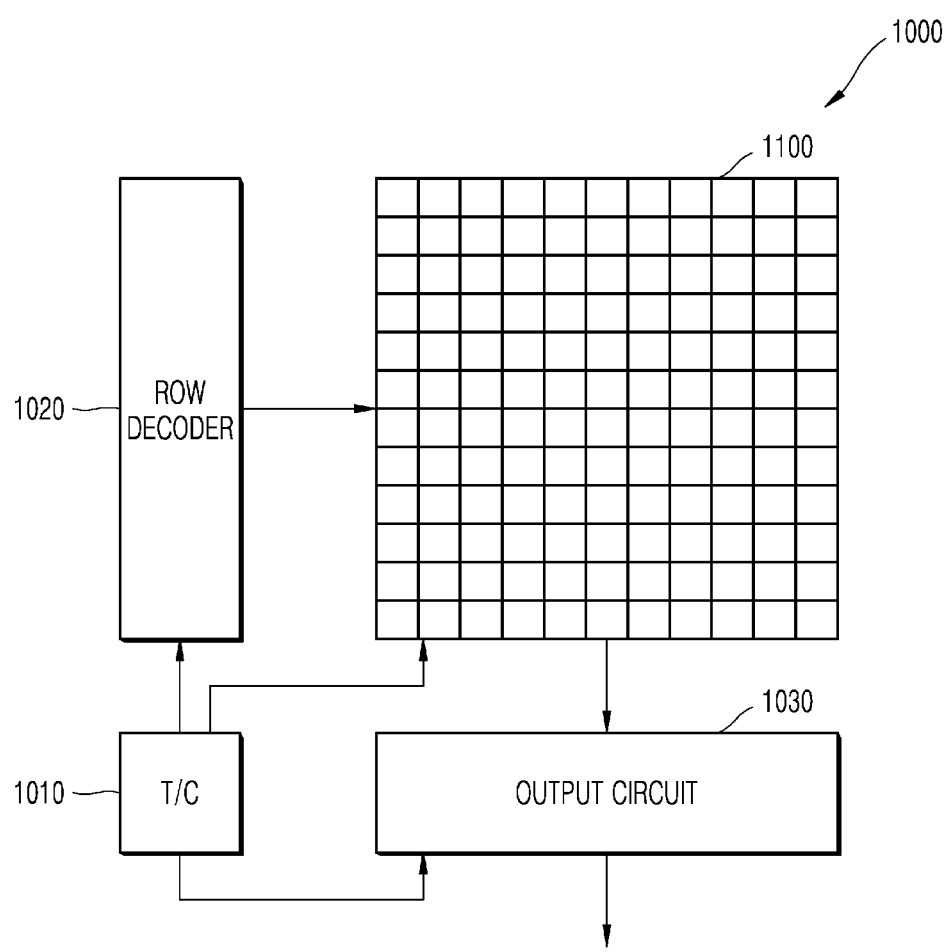
FIG. 1 is a block diagram of an optical sensor according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, an optical sensor including a planar nanophotonic microlens array and an electronic apparatus including the optical sensor will be described in detail with reference to accompanying drawings. The embodiments of the disclosure are capable of various modifications and may be embodied in many different forms. In the drawings, like reference numerals denote like components, and sizes of components in the drawings may be exaggerated for convenience of explanation.

When a layer, a film, a region, or a panel is referred to as being "on" another element, it may be directly on/under/at left/right sides of the other layer or substrate, or intervening layers may also be present.

It will be understood that although the terms "first," "second," etc. may be used herein to describe various components, these components should not be limited by these terms. These components are only used to distinguish one component from another. These terms do not limit that materials or structures of components are different from one another.

An expression used in the singular encompasses the expression of the plural, unless it has a clearly different meaning in the context. It will be further understood that when a portion is referred to as "comprises" another component, the portion may not exclude another component but may further comprise another component unless the context states otherwise.

In addition, the terms such as " . . . unit", "module", etc. provided herein indicates a unit performing a function or operation, and may be realized by hardware, software, or a combination of hardware and software.

The use of the terms of "the above-described" and similar indicative terms may correspond to both the singular forms and the plural forms.

Also, the steps of all methods described herein may be performed in any suitable order unless otherwise indicated herein or otherwise clearly contradicted by context. Also, the use of all exemplary terms (for example, etc.) is only to describe a technical spirit in detail, and the scope of rights is not limited by these terms unless the context is limited by the claims.

FIG. 1 is a block diagram of an optical sensor 1000 according to an example embodiment. Referring to FIG. 1, the optical sensor 1000 may include a pixel array 1100, a timing controller 1010, a row decoder 1020, and an output circuit 1030. The optical sensor 1000 may include, for example, a charge-coupled device (CCD) image sensor or a complementary metal oxide semiconductor (CMOS) image sensor.

The pixel array 1100 includes pixels that are two-dimensionally arranged in a plurality of rows and columns. The row decoder 1020 selects one of the rows in the pixel array 1100 in response to a row address signal output from the timing controller 1010. The output circuit 1030 outputs a photosensitive signal, in a column unit, from a plurality of pixels arranged in the selected row. To this end, the output circuit 1030 may include a column decoder and an analog-to-digital converter (ADC). For example, the output circuit 1030 may include the column decoder and a plurality of ADCs arranged respectively for the columns in the pixel array 1100 or one ADC arranged at an output end of the column decoder. The timing controller 1010, the row decoder 1020, and the output circuit 1030 may be implemented as one chip or in separate chips. A processor for processing an image signal output from the output circuit 1030 may be implemented as one chip with the timing controller 1010, the row decoder 1020, and the output circuit 1030.

The pixel array 1100 may include a plurality of pixels that sense light of different wavelengths. The pixel arrangement may be implemented in various ways. For example, FIGS. 2A to 2C are diagrams showing examples of various pixel arrangements of a pixel array of an optical sensor.

Figure 2A:
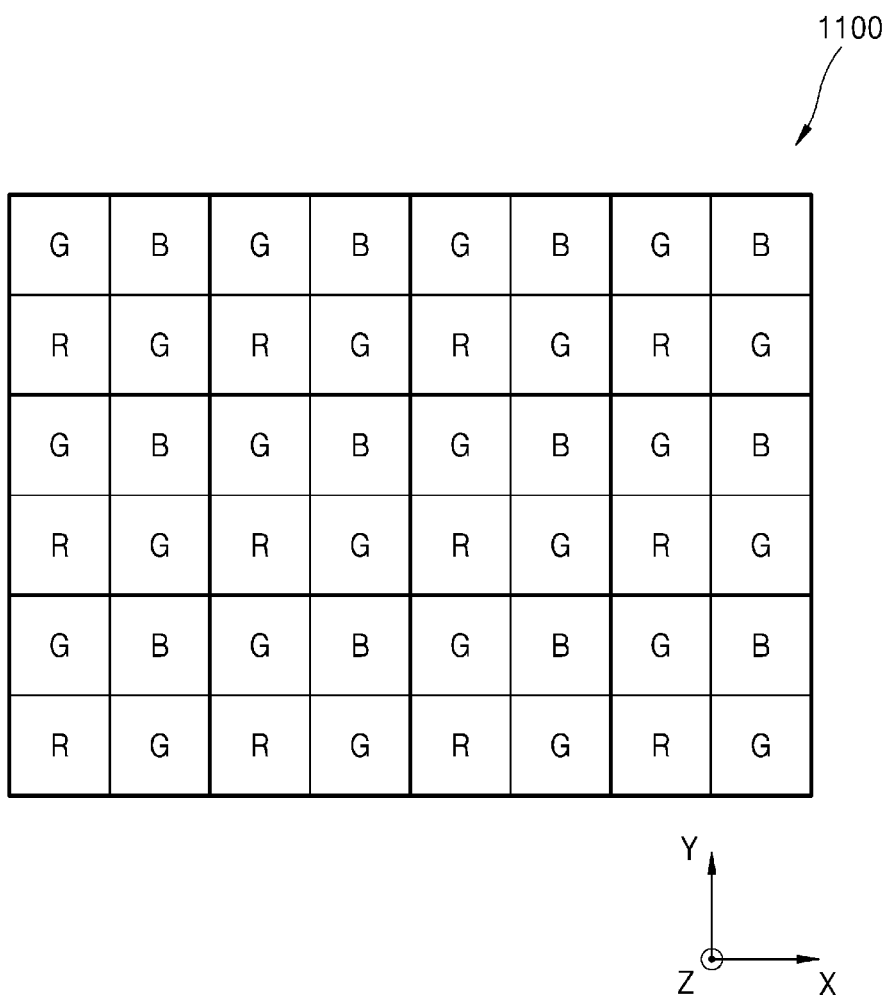

FIG. 2A shows a Bayer pattern that is generally adopted in an image sensor. Referring to FIG. 2A, one unit pattern includes four quadrant regions, and first through fourth quadrants may be the blue pixel B, the green pixel G, the red pixel R, and the green pixel G, respectively. The unit patterns may be repeatedly and two-dimensionally arranged in a first direction (X direction) and a second direction (Y direction). In other words, two green pixels G are arranged in one diagonal direction and one blue pixel B and one red pixel R are arranged in another diagonal direction in a unit pattern of a 2×2 array. In the entire arrangement of pixels, a first row in which a plurality of green pixels G and a plurality of blue pixels B are alternately arranged in the first direction and a second row in which a plurality of red pixels R and a plurality of green pixels G are alternately arranged in the first direction are repeatedly arranged in a second direction.

The pixel array 1100 may be arranged in various arrangement patterns, rather than the Bayer pattern. For example, referring to FIG. 2B, a CYGM arrangement, in which a magenta pixel M, a cyan pixel C, a yellow pixel Y, and a green pixel G configure one unit pattern, may be used. Also, referring to FIG. 2C, an RGBW arrangement, in which a green pixel G, a red pixel R, a blue pixel, and a white pixel W configure one unit pattern, may be used. The unit pattern may have a 3×2 array form. In addition to the above examples, the pixels in the pixel array 1100 may be arranged in various ways according to usages and characteristics of the optical sensor 1000. Hereinafter, it will be described that the pixel array 1100 of the optical sensor 1000 has a Bayer pattern, but the operating principles may be applied to other patterns of pixel arrangement than the Bayer pattern.

The optical sensor 1000 may be applied to various optical devices such as a camera module. For example, FIG. 3 is a conceptual diagram of a camera module 1880 according to an example embodiment.

Figure 3:
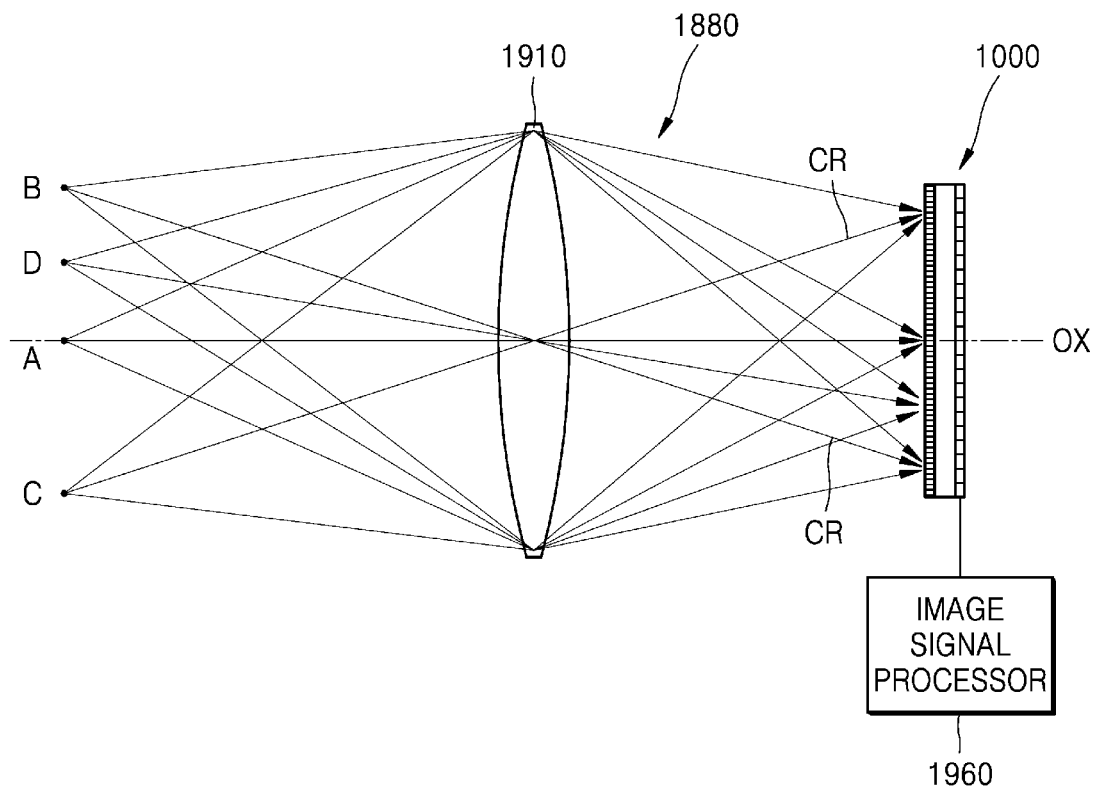
FIG. 3 is a conceptual diagram of a camera module according to an example embodiment.

Referring to FIG. 3, the camera module 1880 may include a lens assembly 1910 for focusing light reflected from an object and forming an optical image, the optical sensor 1000 for converting the optical image formed by the lens assembly 1910 into an electrical image signal, and an image signal processor 1960 for processing the electrical signal output from the optical sensor 1000 as an image signal. The camera module 1880 may further include an infrared (IR) cut-off filter between the optical sensor 1000 and the lens assembly 1910, a display panel for displaying images formed by the image signal processor 1960, and a memory for storing image data formed by the image signal processor 1960. The camera module 1880 may be installed in, for example, mobile electronic devices such as a mobile phone, a laptop computer, a tablet PC, etc.

The lens assembly 1910 focuses an image of an object that is on the outside of the camera module 1880 onto the optical sensor 1000, in particular, the pixel array 1100 of the optical sensor 1000. FIG. 3 briefly shows only one lens for convenience of description, but the lens assembly 1910 may include a plurality of lenses. When the pixel array 1100 is accurately located on a focal plane of the lens assembly 1910, light incident from the object is focused on the pixel array 1100 through the lens assembly 1910. For example, light starting from a certain point A on an optical axis OX passes through the lens assembly 1910 and then arrives at a center of the pixel array 1100 on the optical axis OX. Also, light starting from any one of points B, C, and D located out of the optical axis OX travels across the optical axis OX by the lens assembly 1910 and arrives at a point in a peripheral portion of the pixel array 1100. For example, in FIG. 3, light starting from the point B located above the optical axis OX arrives at a lower peripheral portion of the pixel array 1100, crossing the optical axis OX, and light starting from the point C located under the optical axis OX arrives at an upper peripheral portion of the pixel array 1100, crossing the optical axis OX. Also, light starting from the point D located between the optical axis OX and the point B arrives at a position between the lower peripheral portion and the center of the pixel array 1100.

Accordingly, the lights starting from the different points A, B, C, and D are incident on the pixel array 1100 at different incident angles according to the distances between the points A, B, C, and D and the optical axis OX. An incident angle of the light incident on the pixel array 1100 is defined to be a chief ray angle (CRA). The term "chief ray" denotes a light ray starting from a point of the object and arriving at the pixel array 1100 by passing through a center of the lens assembly 1910 (or by passing through a center of an aperture stop of the lens assembly 1910). The chief ray may pass through the center of the lens assembly 1910 (or the center of the aperture stop of the lens assembly 1910) while a marginal ray may pass through an edge of the lens assembly 1910 (or the edge of the aperture stop of the lens assembly 1910). The term "CRA" denotes an angle formed by the chief ray with respect to the optical axis OX. The CRA of the light starting from the point A on the optical axis OX is 0° and the light is perpendicularly incident on the pixel array 1100. The CRA increases as the starting point is farther away from the optical axis OX.

From the viewpoint of the pixel array 1100, the CRA of the light incident on the center portion of the pixel array 1100 is 0° and the CRA of the incident light gradually increases toward the edge of the pixel array 1100. For example, the CRA of the light starting from each of the points B and C and arriving at the outermost edge of the pixel array 1100 is the largest, whereas the CRA of the light starting from the point A and arriving at the center of the pixel array 1100 is 0°. Also, the CRA of the light starting from the point D and arriving at a position between the center and the edge of the pixel array 1100 is greater than 0° and less than the CRA of the light starting from each of the points B and C.

Figure 4:
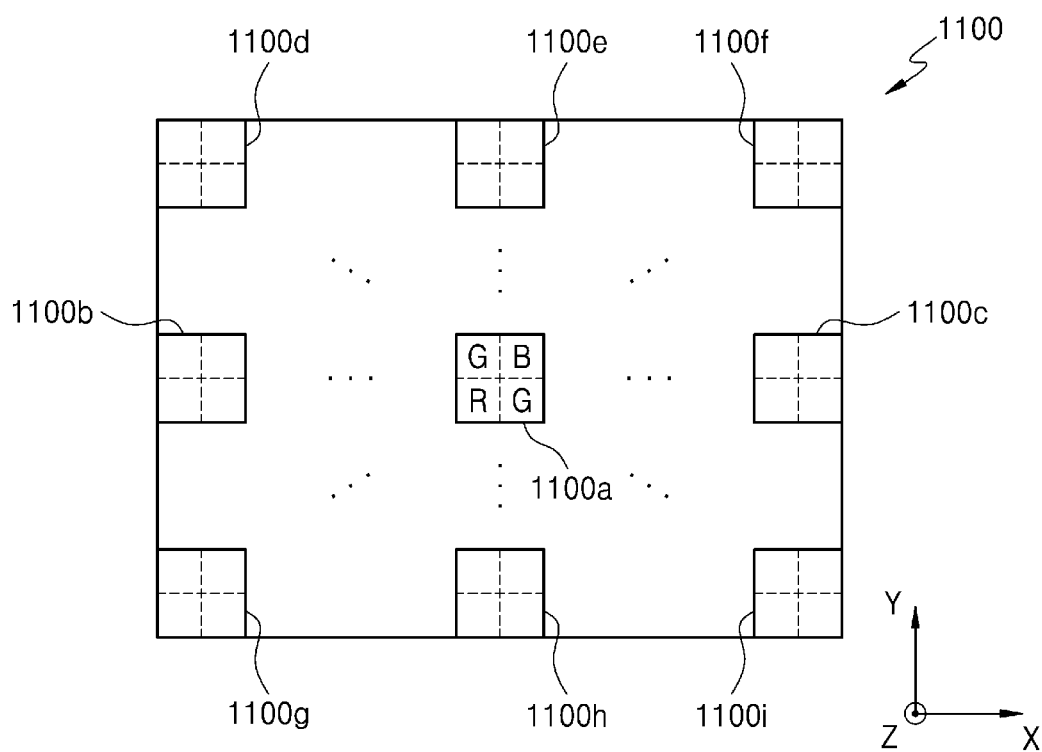
FIG. 4 is a plan view of a pixel array in an optical sensor according to an example embodiment.

Therefore, the CRA of the incident light incident on the pixels varies depending on positions of the pixels in the pixel array 1100. For example, FIG. 4 is a plan view of the pixel array 1100 of an optical sensor according to an example embodiment. Referring to FIG. 4, at a center portion 1100*a* of the pixel array 1100, the CRA is 0° both in a first direction (X direction) and a second direction (Y direction). Also, the CRA in the first direction gradually increases as an object point moves farther away from the center portion 1100*a* in the first direction, and the CRA in the first direction is the largest at opposite edges 1100*b* and 1100*c* in the first direction. Also, the CRA in the second direction gradually increases as an object point moves farther away from the center portion 1100*a* in the second direction, and the CRA in the second direction is the largest at opposite edges 1100*e* and 1100*h* in the second direction. In addition, the CRA in the first direction and the CRA in the second direction both gradually increase away from the center portion 1100*a* in a diagonal direction, and the CRAs in the first and second directions are largest at vertexes 1100*d*, 1100*f*, 1100*g*, and 1100*i*. When the CRA of the incident light incident on the pixels increases, sensitivity of the pixels may degrade. According to the embodiment, in order to prevent or reduce degradation in the sensitivity of pixels located at edges of the pixel array 1100, the planar nano-photonic microlens array may be arranged in the pixel array 1100 of the optical sensor 1000.

Figure 5A:
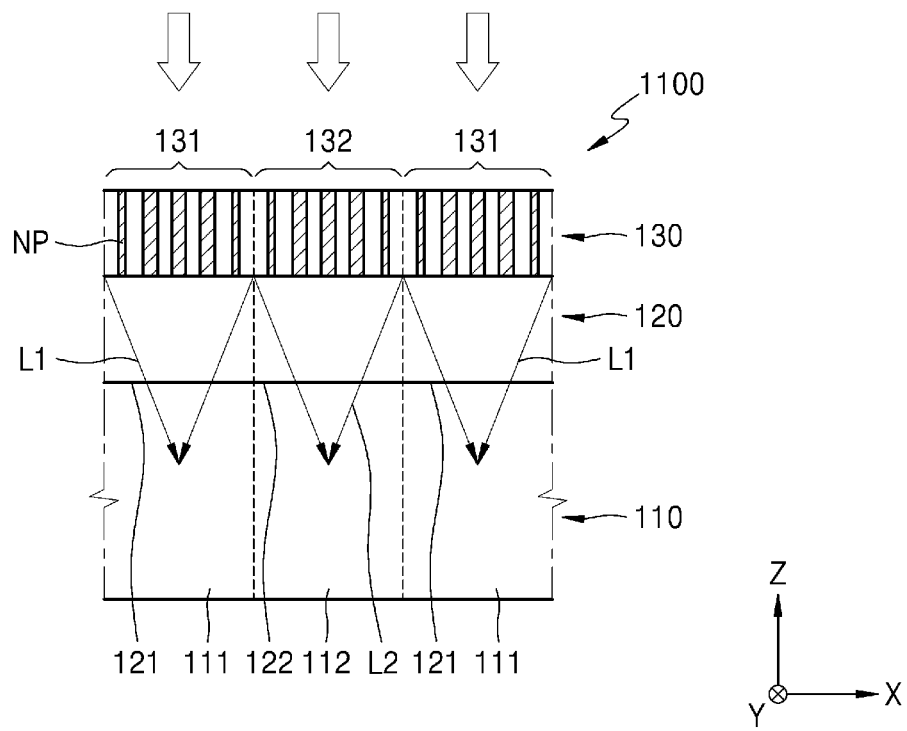
FIGS. 5A and 5B are cross-sectional views of a center in a pixel array in an optical sensor according to an example embodiment, seen from different cross-sections.
Figure 5B:
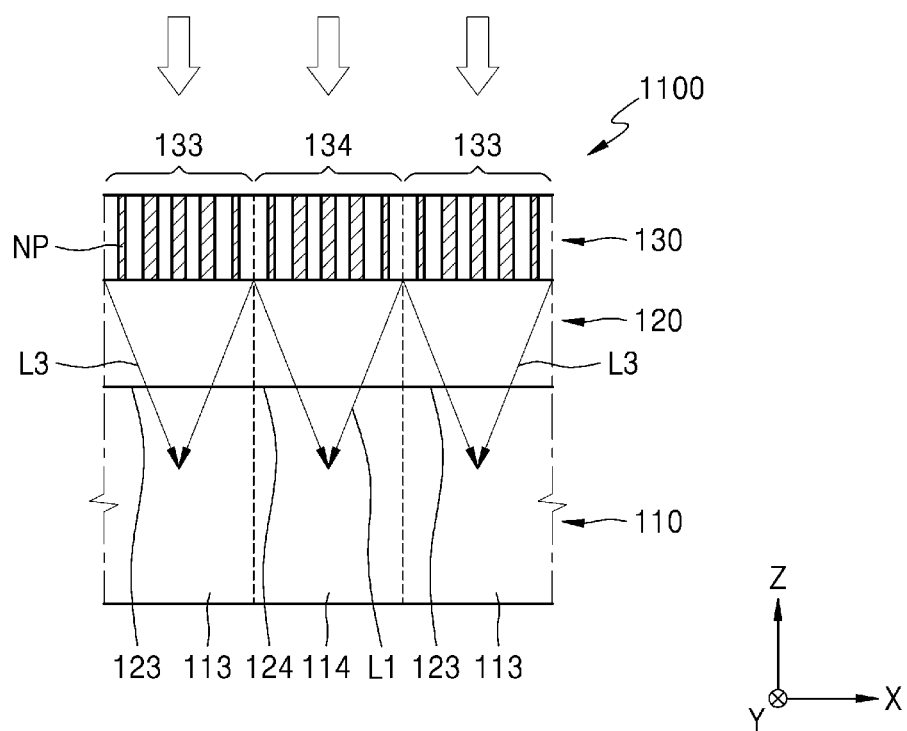

FIGS. 5A and 5B are cross-sectional views of the center portion 1100*a* of the pixel array 1100 of the optical sensor 1000 according to the embodiment, seen from different cross-sections. Referring to FIGS. 5A and 5B, the pixel array 1100 of the optical sensor 1000 may include a sensor substrate 110, a filter layer 120 on the sensor substrate 110, and a planar nano-photonic microlens array 130 on the filter layer 120.

The sensor substrate 110 may include a plurality of photosensitive cells 111, 112, 113, and 114 that sense light. For example, the sensor substrate 110 may include a first photosensitive cell 111, a second photosensitive cell 112, a third photosensitive cell 113, and a fourth photosensitive cell 114 that convert light into electrical signals. As shown in FIG. 5A, the first photosensitive cell 111 and the second photosensitive cell 112 may be alternately arranged in the first direction (X direction), and in a cross-section in which the second direction (Y direction) location is different from FIG. 5A, the third photosensitive cell 113 and the fourth photosensitive cell 114 may be alternately arranged, as shown in FIG. 5B. The above arrangement is for separately sensing the incident light by unit patterns such as Bayer pattern, and a plurality of unit patterns each including the first to fourth photosensitive cells 111, 112, 113, and 114 may be two-dimensionally arranged in the first and second directions. For example, the first and fourth photosensitive cells 111 and 114 may sense green light, the second photosensitive cell 112 may sense blue light, and the third photosensitive cell 113 may sense red light. A separator (e.g., a partition wall or a dividing wall) for separating cells may be further formed on a boundary between cells.

The filter layer 120 may include a plurality of filters 121, 122, 123, and 124, each of which only transmits light of a certain wavelength band and absorbs light of the other wavelength bands. For example, the filter layer 120 may include a first filter 121 on the first photosensitive cell 111, the first filter only transmitting light of a first wavelength band, a second filter 122 on the second photosensitive cell 112, the second filter only transmitting light of a second wavelength band that is different from the first wavelength band, a third filter 123 on the third photosensitive cell 113, the third filter 123 only transmitting light of a third wavelength band that is different from the first and second wavelength bands, and a fourth filter 124 on the fourth photosensitive cell 114, the fourth filter 124 only transmitting light of the first wavelength band. Therefore, the first filter 121 and the second filter 122 are alternately arranged in the first direction, and in a cross-section in which the second direction is differently arranged, the third filter 123 and the fourth filter 124 may be alternately arranged. For example, the first and fourth filters 121 and 124 may only transmit green light, the second filter 122 may only transmit blue light, and the third filter 113 may only transmit red light. The first to fourth filters 121, 122, 123, and 124 may be two-dimensionally arranged in the first and second directions.

The planar nano-photonic microlens array 130 on the filter layer 120 may include a plurality of planar nano-photonic microlenses 131, 132, 133, and 134 that are two-dimensionally arranged. The plurality of planar nano-photonic microlenses 131, 132, 133, and 134 may be in one-to-one correspondence with the plurality of filters 121, 122, 123, and 124 and with the plurality of photosensitive cells 111, 112, 113, and 114. For example, the planar nano-photonic microlens array 130 may include a first planar nano-photonic microlens 131 on the first filter 121, a second planar nano-photonic microlens 132 on the second filter 122, a third planar nano-photonic microlens 133 on the third filter 123, and a fourth planar nano-photonic microlens 134 on the fourth filter 124. Therefore, the first planar nano-photonic microlens 131 and the second planar nano-photonic microlens 132 are alternately arranged in the first direction, and in a cross-section in which the second direction location is different from FIG. 5A, the third planar nano-photonic microlens 133 and the fourth planar nano-photonic microlens 134 may be alternately arranged.

The first to fourth planar nano-photonic microlenses 131, 132, 133, and 134 may be two-dimensionally arranged in the first and second directions so as to face the corresponding filters and corresponding photosensitive cells. For example, the first photosensitive cell 111, the first filter 121, and the first planar nano-photonic microlens 131 may be arranged facing one another in a third direction (Z direction) that is perpendicular to the first and second directions. Also, the second photosensitive cell 112, the second filter 122, and the second planar nano-photonic microlens 132 face one another in the third direction, the third photosensitive cell 113, the third filter 123, and the third planar nano-photonic microlens 133 face one another in the third direction, and the fourth photosensitive cell 114, the fourth filter 124, and the fourth planar nano-photonic microlens 134 face one another in the third direction.

The first to fourth planar nano-photonic microlenses 131, 132, 133, and 134 may be configured to condense light onto corresponding photosensitive cells from among the first to fourth photosensitive cells 111, 112, 113, and 114. For example, the first planar nano-photonic microlens 131 may condense incident light onto the first photosensitive cell 111, the second planar nano-photonic microlens 132 may condense incident light onto the second photosensitive cell 112, the third planar nano-photonic microlens 133 may condense incident light onto the third photosensitive cell 113, and the fourth planar nano-photonic microlens 134 may condense incident light onto the fourth photosensitive cell 114. In the condensed incident light, light of the first wavelength L1 may only pass through the first and fourth filters 121 and 124 and is condensed onto the first and fourth photosensitive cells 111 and 114, light of the second wavelength band L2 may only pass through the second filter 122 and is condensed onto the second photosensitive cell 112, and light of the third wavelength band L3 may only pass through the third filter 123 and is condensed onto the third photosensitive cell 113.

As shown in FIGS. 5A and 5B, at the center portion 1100a of the pixel array 1100, the incident light is perpendicularly incident on the planar nano-photonic microlens array 130. In other words, the CRA of the incident light is 0° at the center portion 1100a of the pixel array 1100. Therefore, there is no need to change the proceeding direction of the incident light at the center portion 1100a of the pixel array 1100, and thus, the first to fourth planar nano-photonic microlenses 131, 132, 133, and 134 arranged on the center portion 1100a of the pixel array 1100 may be configured to condense the incident light onto the corresponding photosensitive cells without changing the proceeding direction of the incident light.

To do this, the first to fourth planar nano-photonic microlenses 131, 132, 133, and 134 may have nano-pattern structures for condensing light. The nano-pattern structure may include a plurality of nano-structures NP that change a phase of incident light according to an incident position. Shapes, sizes (widths and heights), intervals, and arrangement shapes of the plurality of nano-structures NP may be determined such that the light immediately after passing through each of the first to fourth planar nano-photonic microlenses 131, 132, 133, and 134 may have a certain phase profile. According to the phase profile, a proceeding direction and a focal distance of the light after passing through each of the first to fourth planar nano-photonic microlenses 131, 132, 133, and 134 may be determined.

Figure 6:
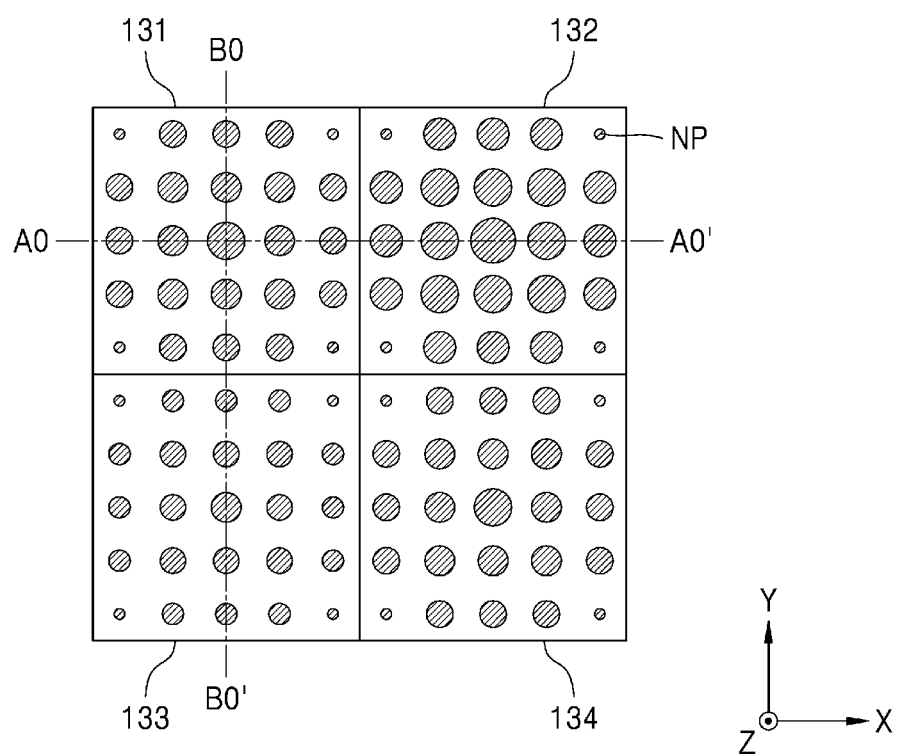
FIG. 6 is a plan view showing an example of a nano-pattern structure at a center portion of a planar nano-photonic microlens array of an optical sensor according to an example embodiment.

FIG. 6 is a plan view showing an example of a nano-pattern structure at the center portion 1100a of the planar nano-photonic microlens array 130 in the optical sensor 1000. Referring to FIG. 6, the nano-structures NP in the nano-pattern structure may be each formed as a nano-post, a cross-section of which has a diameter having sub-wavelength dimensions. Here, the sub-wavelength refers to a wavelength that is less than a wavelength band of condensed light. When the incident light is a visible ray, the cross-sectional diameter of the nano-structure NP may be less than, for example, 400 nm, 300 nm, or 200 nm. In addition, a height of the nano-structure NP may be about 500 nm to about 1500 nm, which is greater than the cross-sectional diameter of the nano-structure.

The nano-structures NP may include a material having a relatively higher refractive index as compared with a peripheral material and having a relatively lower absorption ratio in the visible ray band. For example, the nano-structures NP may include c-Si, p-Si, a-Si and a Group III-V compound semiconductor (e.g., GaP, GaN, GaAs etc.), SiC, $TiO_2$, $SiN_3$, ZnS, ZnSe, $Si_3N_4$, and/or a combination thereof. Periphery of the nano-structures NP may be filled with a dielectric material having a relatively lower refractive index as compared with the nano-structures NP and have a relatively low absorption ratio in the visible ray band. For example, the periphery of the nano-structures NP may be filled with $SiO_2$, siloxane-based spin on glass (SOG), air, etc. The nano-structures NP having a difference in a refractive index between the refractive index of the peripheral material may change the phase of light that passes through the nano-structures NP. This is caused by phase delay that occurs due to the shape dimension of the sub-wavelength of the nano-structures NP, and a degree at which the phase is delayed, may be determined by a detailed shape dimension and arrangement shape of the nanostructures NP.

Figure 7A:
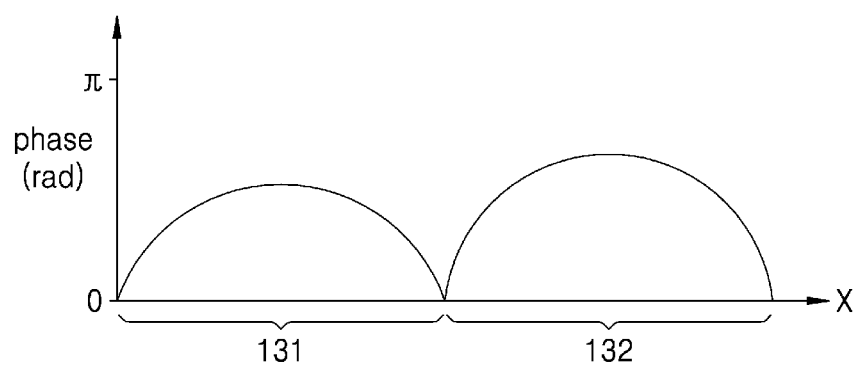
FIGS. 7A and 7B show examples of phase profiles of light immediately after passing through a planar nano-photonic microlens array at a center portion of a pixel array of an optical sensor according to an example embodiment.
Figure 7B:
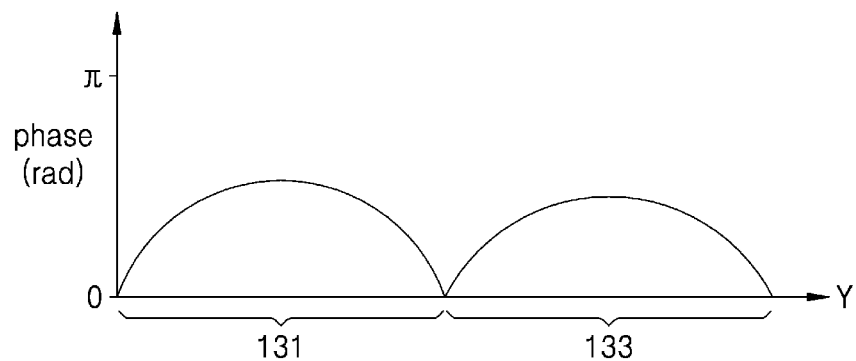

FIGS. 7A and 7B show examples of phase profiles of light immediately after passing through the planar nano-photonic microlens array 130 at the center portion 1100a of the pixel array 1100 of the optical sensor 1000 according to an example embodiment. In particular, FIG. 7A shows the phase profile of the light immediately after passing through the first planar nano-photonic microlens 131 and the second planar nano-photonic microlens 132 in the first direction taken along line A0-A0' of FIG. 6, and FIG. 7B shows the phase profile of the light immediately after passing through the first planar nano-photonic microlens 131 and the third planar nano-photonic microlens 133 in the second direction taken along line B0-B0' of FIG. 6. The phase profile in FIGS. 7A and 7B may be expressed as a phase change curve that shows a change in the phase in the first direction and the second direction, respectively.

Referring to FIG. 7A, the light immediately after passing through the first planar nano-photonic microlens 131 has a phase profile that is largest at the center of the first planar nano-photonic microlens 131 and is reduced as distance of a light incident position from the center of the first planar nano-photonic microlens 131 increases in the first direction. The light immediately after passing through the second planar nano-photonic microlens 132 has a phase profile that is largest at the center of the second planar nano-photonic microlens 132 and is reduced as distance of a light incident position from the center of the second planar nano-photonic microlens 132 increases in the first direction. Referring to FIG. 7B, the light immediately after passing through the first planar nano-photonic microlens 131 has a phase profile that is largest at the center of the first planar nano-photonic microlens 131 and is reduced as distance of a light incident position from the center of the first planar nano-photonic microlens 131 increases in the second direction. The light immediately after passing through the third planar nano-photonic microlens 133 has a phase profile that is largest at the center of the third planar nano-photonic microlens 133 and is reduced as distance of a light incident position from the center of the third planar nano-photonic microlens 133 increases in the second direction.

At the center portion 1100a of the pixel array 1100 where the CRA with respect to the first and second directions is 0°, there is no need for the first to fourth planar nano-photonic microlenses 131, 132, 133, and 134 to change the proceeding direction of the incident light, and thus, as shown in FIGS. 7A and 7B, the first to fourth planar nano-photonic microlenses 131, 132, 133, and 134 may be configured so as to implement the phase profile that is symmetrically convex both in the first and second directions. Although not shown in FIGS. 7A and 7B, the light immediately after passing through the second planar nano-photonic microlens 132 may also have the phase profile that is symmetrically convex in the second direction, the light immediately after passing through the third planar nano-photonic microlens 133 may also have the phase profile that is symmetrically convex in the first direction, and the light immediately after passing through the fourth planar nano-photonic microlens 134 may also have the phase profile that is symmetrically convex both in the first and second directions.

Referring back to FIG. 6, in order to implement the above phase profile, the plurality of nano-structures NP may be symmetrically arranged in the first and second directions with respect to the center of each of the first to fourth planar nano-photonic microlenses 131, 132, 133, and 134. In particular, the nano-structures NP arranged at the centers of the first to fourth planar nano-photonic microlenses 131, 132, 133, and 134 may each have the largest diameter such that the largest phase delay may occur at the center portion of each of the first to fourth planar nano-photonic microlenses 131, 132, 133, and 134, and the diameters of the nano-structures NP may be gradually reduced as the distance of the position of the nano-structures NP from the center portion increases in each of the first to fourth planar nano-photonic microlenses 131, 132, 133, and 134. For example, the nano-structures NP arranged at vertex regions in each of the first to fourth planar nano-photonic microlenses 131, 132, 133, and 134 may have the smallest diameters.

However, the nano-structures NP arranged in the region having a relatively small phase delay do not necessarily have relatively smaller diameters. In the phase profiles shown in FIGS. 7A and 7B, a value of phase delay is indicated by a remainder value after divided by 2π. For example, when a phase delay in a certain region is 37, the phase delay is optically the same as the remaining π after removing 2π. Therefore, when the diameter of the nano-structure NP is so small and is difficult to be manufactured, the diameter of the nano-structure NP may be selected so as to implement the delay phase increased by 2π. For example, when the diameter of the nano-structure NP for achieving the phase delay of 0.17 is too small, the diameter of the nano-structure NP may be selected so as to achieve the phase delay of 2.17. Therefore, in this case, the nano-structures NP arranged on four vertex regions in each of the first to fourth planar nano-photonic microlenses 131, 132, 133, and 134 may have the largest diameters.

In addition, the phase profile of the convex curve shape allows the first to fourth planar nano-photonic microlenses 131, 132, 133, and 134 to act as convex lenses with respect to the incident light. Therefore, the light passed through the first to fourth planar nano-photonic microlenses 131, 132, 133, and 134 may be condensed onto the first to fourth photosensitive cells 111, 112, 113, and 114, respectively. However, the light of different wavelengths is condensed onto the first to fourth photosensitive cells 111, 112, 113, and 114 due to the plurality of filters 121, 122, 123, and 124. For example, light of the first wavelength is condensed onto the first and fourth photosensitive cells 111 and 114, light of the second wavelength is condensed onto the second photosensitive cell 112, and light of the third wavelength is condensed onto the third photosensitive cell 113.

Therefore, the nano-structures NP in each of the first to fourth planar nano-photonic microlenses 131, 132, 133, and 134 may be designed based on the wavelength band of the light condensed onto the corresponding photosensitive cell. For example, the nano-structures NP of the first and fourth planar nano-photonic microlenses 131 and 134 may be designed such that the light of the first wavelength band (e.g., green light) immediately after passing through the first and fourth planar nano-photonic microlenses 131 and 134 may have the phase profile shown in FIGS. 7A and 7B. Also, the nano-structures NP of the second planar nano-photonic microlens 132 may be designed such that the light of the second wavelength band (e.g., blue light) immediately after passing through the second planar nano-photonic microlens 132 may have the phase profile shown in FIG. 7A, and the nano-structures NP in the third planar nano-photonic microlens 133 may be designed such that the light of the third wavelength band (e.g., red light) immediately after passing through the third planar nano-photonic microlens 133 may have the phase profile shown in FIG. 7B. In other words, the phase profile at the left side in FIGS. 7A and 7B denotes the phase profile of the light of the first wavelength band immediately after passing through the first planar nano-photonic microlens 131, and the phase profile at the right in FIG. 7A denotes the phase profile of the light of the second wavelength band immediately after passing through the second planar nano-photonic microlens 132, and the phase profile at the right side in FIG. 7B denotes the phase profile of the light of the third wavelength band immediately after passing through the third planar nano-photonic microlens 133.

Also, in each of the first to fourth planar nano-photonic microlenses 131, 132, 133, and 134, the nano-structures NP may be designed to have the same focal distance with respect to the light condensed onto the corresponding photosensitive cell. For example, the nano-structures NP may be designed such that the focal distances of the first and fourth planar nano-photonic microlenses 131 and 134 with respect to the light of the first wavelength band, the focal distance of the second planar nano-photonic microlens 132 with respect to the light of the second wavelength band, and the focal distance of the third planar nano-photonic microlens 133 with respect to the light of the third wavelength band are the same.

To do this, as shown in FIGS. 7A and 7B, the phase profiles of the light of the first to third wavelength bands immediately after passing through the first to fourth planar nano-photonic microlenses 131, 132, 133, and 134 may have peaks that are inverse-proportional to the wavelengths. For example, referring to FIG. 7A, a curved shape of the phase profile of the light of the second wavelength band, e.g., blue light, immediately after passing through the second planar nano-photonic microlens 132 may be more convex (i.e., have a greater curvature) than that of the phase profile of the light of the first wavelength band, e.g., green light, immediately after passing through the first planar nano-photonic microlens 131. Also, referring to FIG. 7B, the phase profile of the light of the first wavelength band, e.g., green light, immediately after passing through the first planar nano-photonic microlens 131 may be more convex than that of the light of the third wavelength band, e.g., red light, immediately after passing through the third planar nano-photonic microlens 133.

In order to form the above phase profiles, shapes, sizes (widths and heights), intervals, and arrangement types of the nano-structures NP in each of the first to fourth planar nano-photonic microlenses 131, 132, 133, and 134 may be determined to be different from the others. Otherwise, the nano-structures NP in the first to fourth planar nano-photonic microlenses 131, 132, 133, and 134 may have the same shapes, heights, intervals, and arrangement types, but may be only different in diameters. For example, the diameter of the nano-structure NP at the center region of the third planar nano-photonic microlens 133 that condenses the light of the third wavelength band, e.g., the red light having the longest wavelength, may be less than that of the nano-structures NP at the central regions of the first and fourth planar nano-photonic microlenses 131 and 134 that condense the light of the first wavelength band, e.g., the green light. Also, the diameters of the nano-structures NP at the center portions of the first and fourth planar nano-photonic microlenses 131 and 134 may be less than that of the nano-structure NP at the center region of the second planar nano-photonic microlens 132 that condenses the light of the second wavelength band, e.g., the blue light, having the shortest wavelength.

Figure 8A:
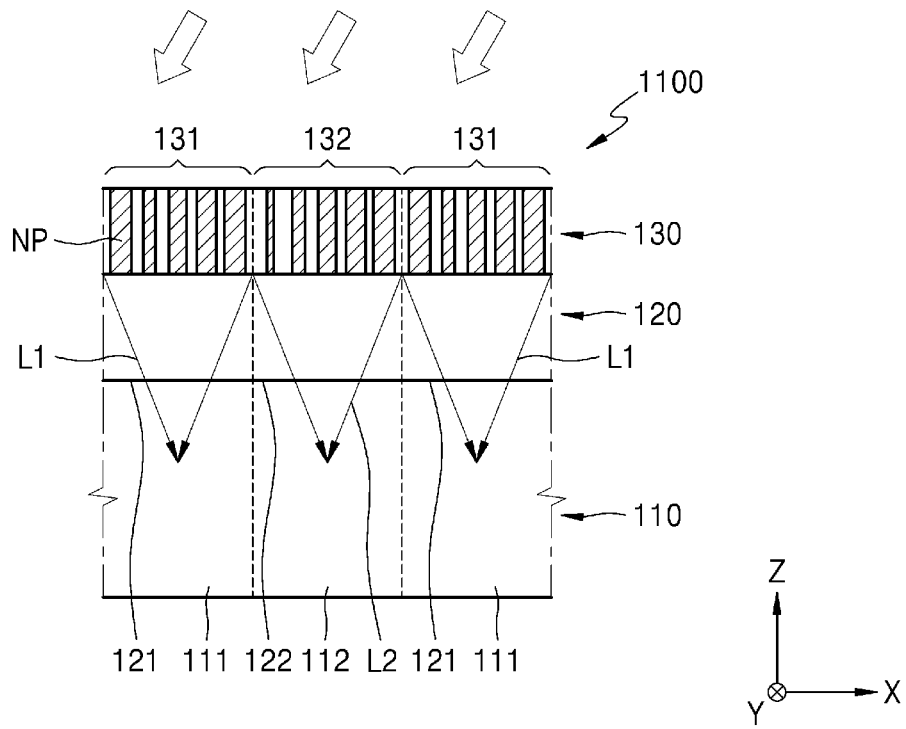
FIGS. 8A and 8B are cross-sectional views of a left edge in a pixel array of an optical sensor according to an example embodiment, seen from different cross-sections.
Figure 8B:
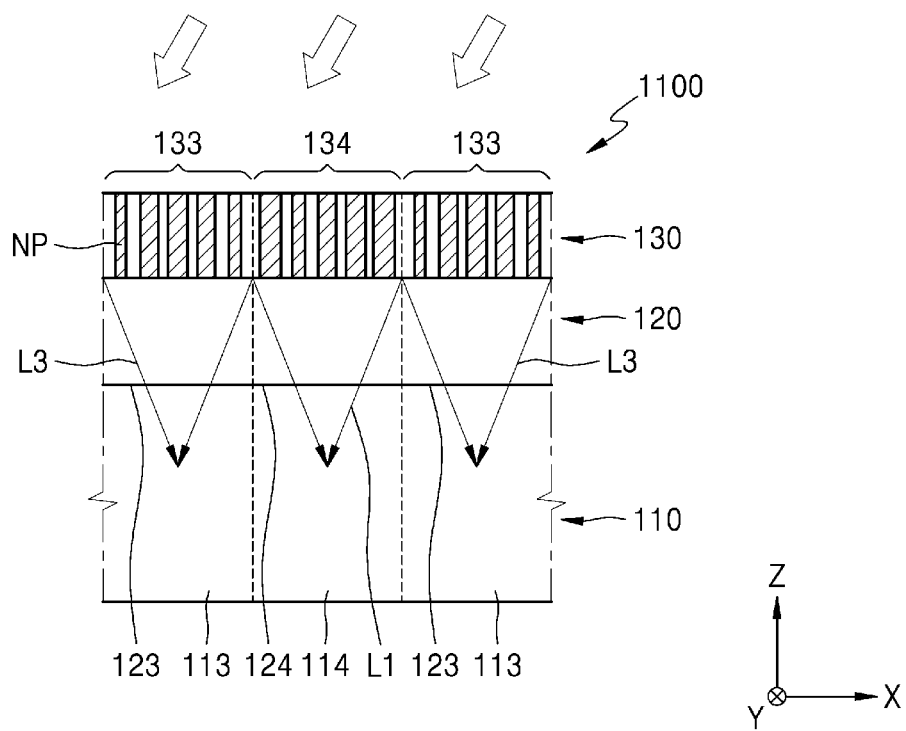

FIGS. 8A and 8B are cross-sectional views of a left edge 1100b of the pixel array 1100 of the optical sensor 1000 according to the embodiment, seen from different cross-sections. Referring to FIGS. 8A and 8B, at the left edge 1100b of the pixel array 1100, the incident light is obliquely incident on the pixel array 1100 in the first direction. The incident angle of the incident light increases from the center portion 1100a toward the left edge 1100b of the pixel array 1100, and is the largest at the left edge 1100b of the pixel array 1100. In other words, the CRA in the first direction is the largest at the left edge 1100b of the pixel array 1100. Therefore, the first to fourth planar nano-photonic microlenses 131, 132, 133, and 134 arranged on the periphery portion of the planar nano-photonic microlens array 130 may be configured so as to deviate the incident light toward the center portion of the corresponding photosensitive cell in order to prevent or reduce degradation in the sensitivity of the pixels. Then, the first to fourth planar nano-photonic microlenses 131, 132, 133, and 134 may condense the incident light onto the center portions of the corresponding photosensitive cells without regard to the incident angle of the incident light.

Figure 9:
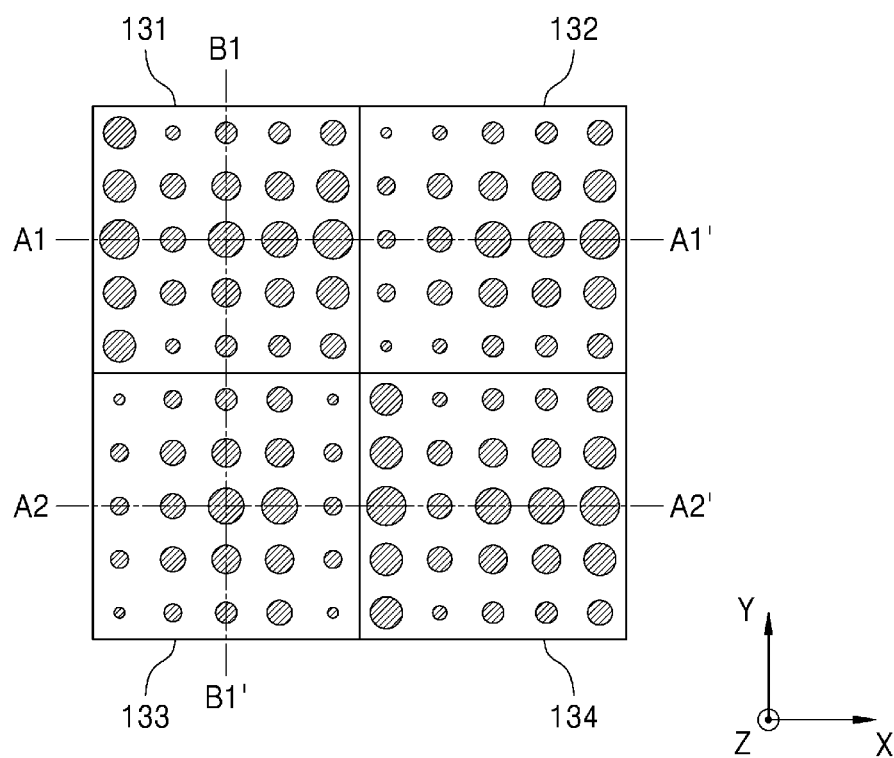
FIG. 9 is a plan view showing an example of a nano-pattern structure at a left edge of a planar nano-photonic microlens array of an optical sensor according to an example embodiment.
Figure 10A:
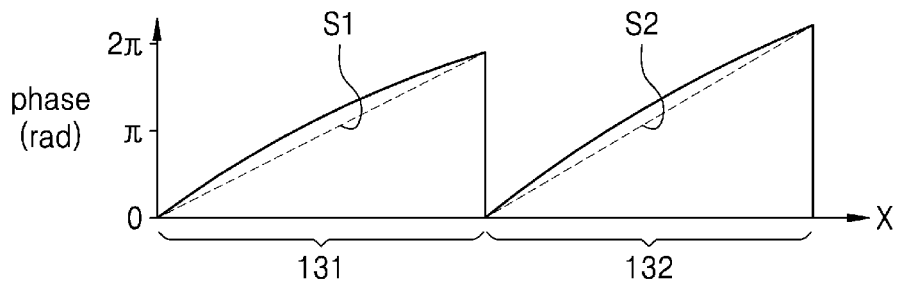
FIG. 10A to 10O show examples of phase profiles of light immediately after passing through a planar nano-photonic microlens array at a left edge of a pixel array of an optical sensor according to an example embodiment.

To do this, the nano-structures NP arranged in each of the first to fourth planar nano-photonic microlenses 131, 132, 133, and 134 may be designed to deviate the proceeding direction of the incident light in the first direction. For example, FIG. 9 is a plan view showing an example of a nano-pattern structure at the left edge of the planar nano-photonic microlens array 130 of the optical sensor 1000, according to an example embodiment. FIGS. 10A to 100 show examples of phase profiles of light immediately after passing through the planar nano-photonic microlens array 130 at the left edge 1100b of the pixel array 1100 of the optical sensor 1000, according to the embodiment. In particular, FIG. 10A shows the phase profile of the light immediately after passing through the first planar nano-photonic microlens 131 and the second planar nano-photonic microlens 132 in the first direction taken along line A1-A1' of FIG. 9, FIG. 10B shows the phase profile of the light immediately after passing through the third planar nano-photonic microlens 133 and the fourth planar nano-photonic microlens 134 in the first direction taken along line A2-A2' of FIG. 9, and FIG. 100 shows the phase profile of the light immediately after passing through the first planar nano-photonic microlens 131 and the third planar nano-photonic microlens 133 in the second direction taken along line B1-B1' of FIG. 9.

Figure 10B:
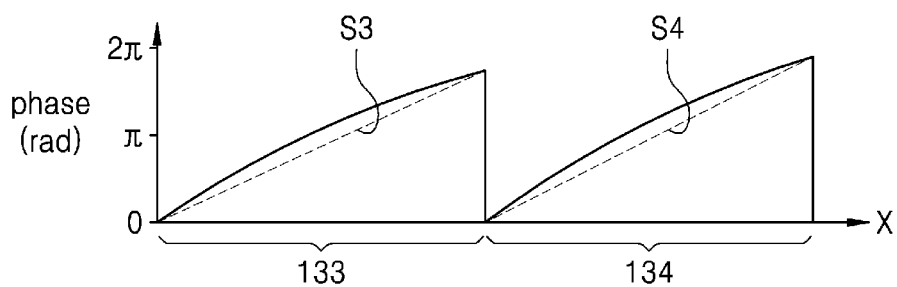
Figure 10C:
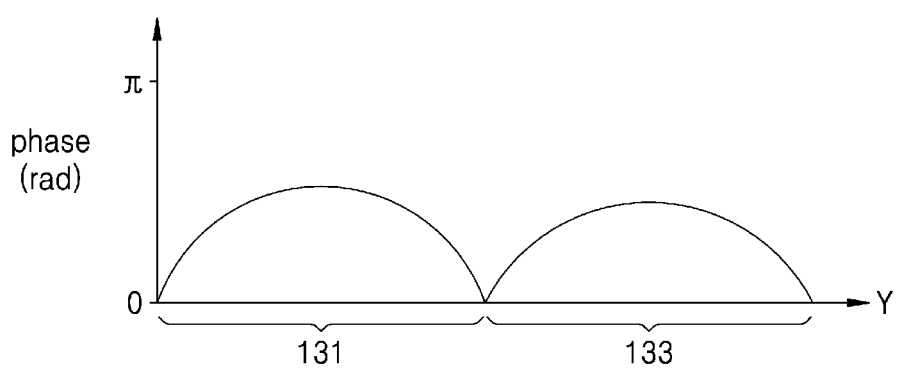

Referring to FIGS. 10A and 10B, the light immediately after passing through each of the first to fourth planar nano-photonic microlenses 131, 132, 133, and 134 in the first direction may have the phase profile including both an inclined linear phase profile and a convex phase profile. For example, the phase profile of the light immediately after passing through the first planar nano-photonic microlens 131 in the first direction may have a shape, in which a first linear phase profile S1 formed as an inclined straight line and a convex curved phase profile are added. Also, the phase profile of the light immediately after passing through each of the second to fourth planar nano-photonic microlenses 132, 133, and 134 in the first direction may also have the shape, in which second to fourth linear phase profiles S2, S3, and S4 that are formed as inclined straight lines and the convex curved phase profile are added. Therefore, the phase profiles in the first direction shown in FIGS. 10A and 10B may be obtained by slanting the convexly curved phase profiles by a slope of the first to fourth linear phase profiles S1, S2, S3, and S4.

The phase profile having the convex curved shape functions to condense the incident light, and the first to fourth linear phase profiles S1, S2, S3, and S4 may deviate the proceeding direction of the incident light. The slope of the first to fourth linear phase profiles S1, S2, S3, and S4 in the first direction may be determined according to the CRA in the first direction and the wavelength band of the light that is to be condensed. The CRA in the first direction increases away from the center portion of the pixel array 1100 or the center portion of the planar nano-photonic microlens array 130 in the first direction. Therefore, the slope of the first to fourth linear phase profiles S1, S2, S3, and S4 in the first direction may also increase away from the center portion of the pixel array 1100 or the center portion of the planar nano-photonic microlens array 130 in the first direction. For example, the slope of each of the first to fourth linear phase profiles S1, S2, S3, and S4 in the first direction may be proportional to a sin value of the incident angle of the incident light that is incident on the planar nano-photonic microlens array 130 in the first direction, e.g., sin value of the CRA, sin (CRA).

In addition, the slope of each of the first to fourth linear phase profiles S1, S2, S3, and S4 may be proportional to a reciprocal number (1/A, here A denotes a wavelength of light) of the wavelength of the light transmitted by the filter corresponding to each of the first to fourth planar nano-photonic microlenses 131, 132, 133, and 134. For example, the first and fourth linear phase profiles S1 and S4 may be in proportional to a reciprocal number of the first wavelength of the green light that has passed through the first and fourth filters 121 and 124 corresponding to the first and fourth planar nano-photonic microlenses 131 and 134, the second linear phase profile S2 may be in proportional to a reciprocal number of the second wavelength of the blue light that has passed through the second filter 122 corresponding to the second planar nano-photonic microlens 132, and the third linear phase profile S3 may be in proportional to a reciprocal number of the third wavelength of the red light that has passed through the third filter 123 corresponding to the third planar nano-photonic microlens 133. Therefore, the slope of the second linear phase profile S2 is the largest, the slopes of the first and fourth linear phase profiles S1 and S4 may be less than that of the second linear phase profile S2, and the slope of the third linear phase profile S3 may be less than those of the first and fourth linear phase profiles S1 and S4.

The CRA in the second direction at the left edge 1100*b* of the pixel array 1100 is 0°. Therefore, there is no need to change the proceeding direction of the incident light in the second direction, and as shown in FIG. 100, the first and third planar nano-photonic microlenses 131 and 133 may be configured such that the phase profiles having the convex curve shapes that are symmetrical in the second direction may be implemented. Although not shown in FIG. 100, the light immediately after passing through the second and fourth planar nano-photonic microlenses 132 and 134 may have the phase profile having the convex curve shape that is symmetrical in the second direction. In this point of view, the slope of the linear phase profile may be 0 in the second direction. To this end, as shown in FIG. 9, the diameters of the nano-structures NP located at the center portion in each of the first to fourth planar nano-photonic microlenses 131, 132, 133, and 134 in the second direction may be greater than those of the nano-structures NP located at the edges in the second direction.

Figure 11A:
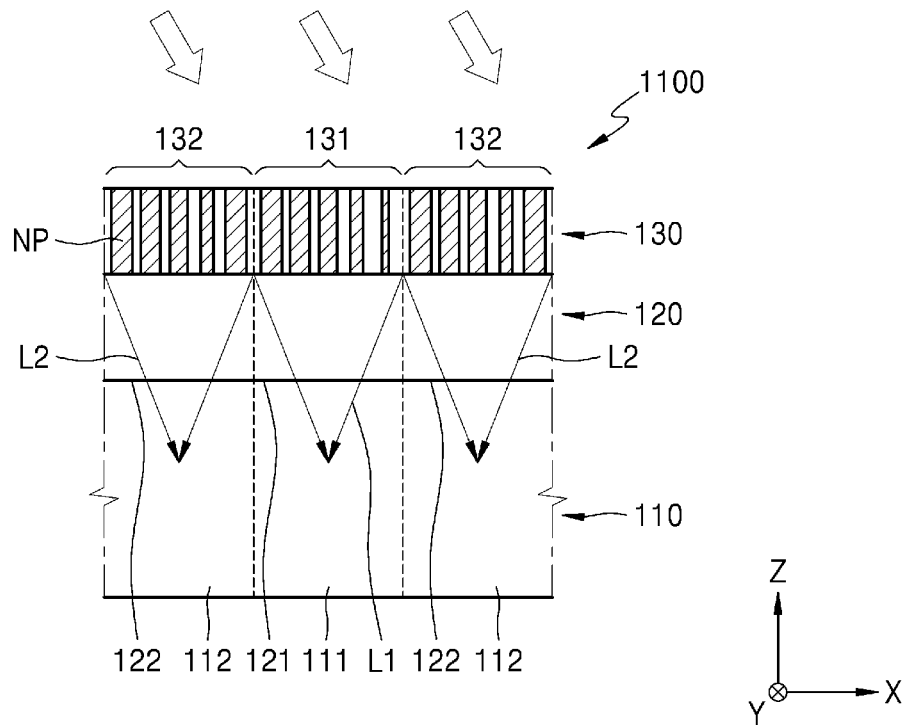
FIGS. 11A and 11B are cross-sectional views of a right edge in a pixel array of an optical sensor according to an example embodiment, seen from different cross-sections.
Figure 11B:
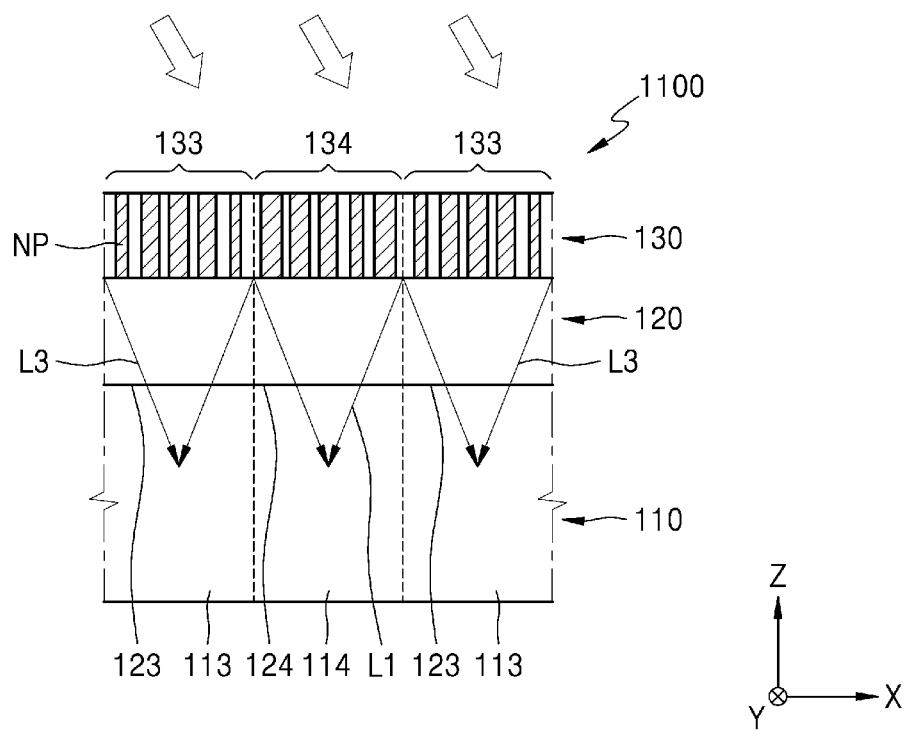

FIGS. 11A and 11B are cross-sectional views of a right edge 1100*c* of the pixel array 1100 of the optical sensor 1000 according to the embodiment, seen from different cross-sections. Referring to FIGS. 11A and 11B, at the right edge 1100*c* of the pixel array 1100, the incident light is obliquely incident on the pixel array 1100, on the basis of a normal of the pixel array 1100, opposite to the incident light on the left edge 1100*b* of the pixel array 1100 1100 shown in FIGS. 8A and 8B. Therefore, the first to fourth planar nano-photonic microlenses 131, 132, 133, and 134 arranged at the right edge of the planar nano-photonic microlens array 130 may be inversed with respect to the first to fourth planar nano-photonic microlenses 131, 132, 133, and 134 at the left edge of the planar nano-photonic microlens array 130 in the first direction. Then, the first to fourth planar nano-photonic microlenses 131, 132, 133, and 134 arranged on the right edge of the planar nano-photonic microlens array 130 may condense the incident light onto the center portions of the corresponding photosensitive cells.

Figure 12:
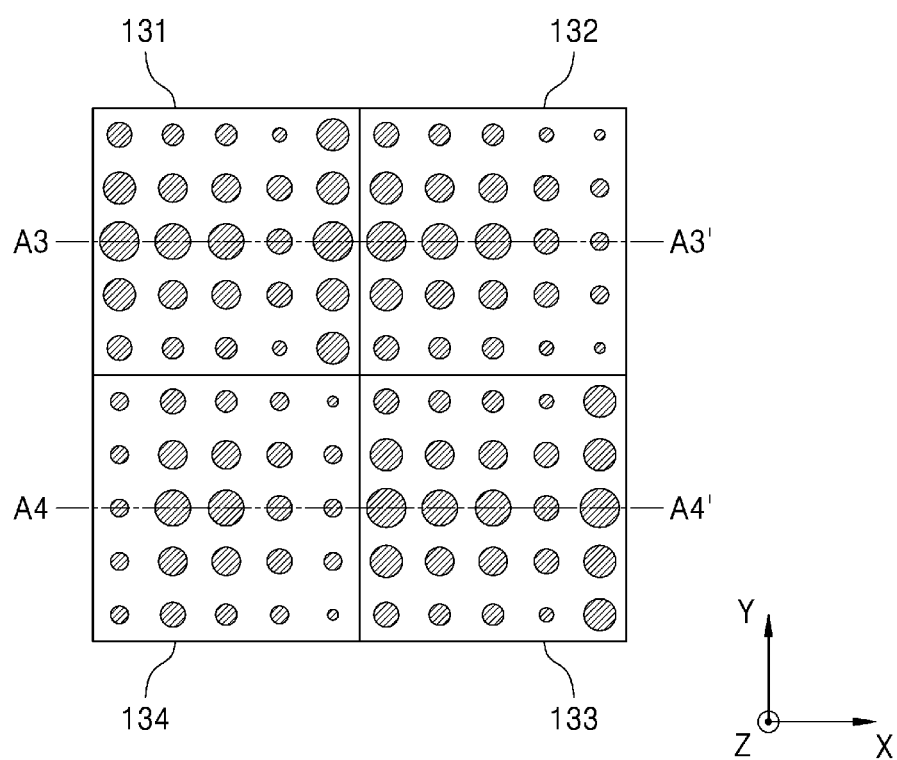
FIG. 12 is a plan view showing an example of a nano-pattern structure at a right edge of a planar nano-photonic microlens array of an optical sensor according to an example embodiment.

FIG. 12 is a plan view showing an example of a nano-pattern structure at the right edge of the planar nano-photonic microlens array 130 of the optical sensor 1000, according to an example embodiment. The nano-structures NP in the first to fourth planar nano-photonic microlenses 131, 132, 133, and 134 shown in FIG. 12 may be arranged in the form of being inverted from the nano-structures NP in the first to fourth planar nano-photonic microlenses 131, 132, 133, and 134 shown in FIG. 9 in the first direction.

Figure 13A:
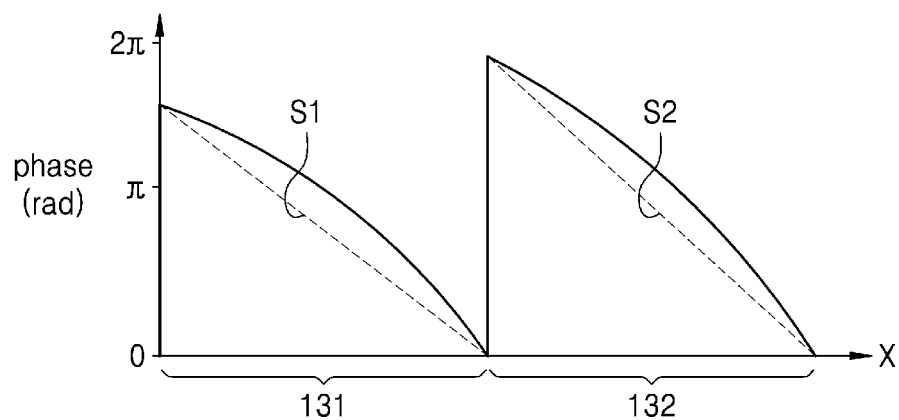
FIGS. 13A and 13B show examples of phase profiles of light immediately after passing through a planar nano-photonic microlens array at a right edge of a pixel array of an optical sensor according to an example embodiment.
Figure 13B:
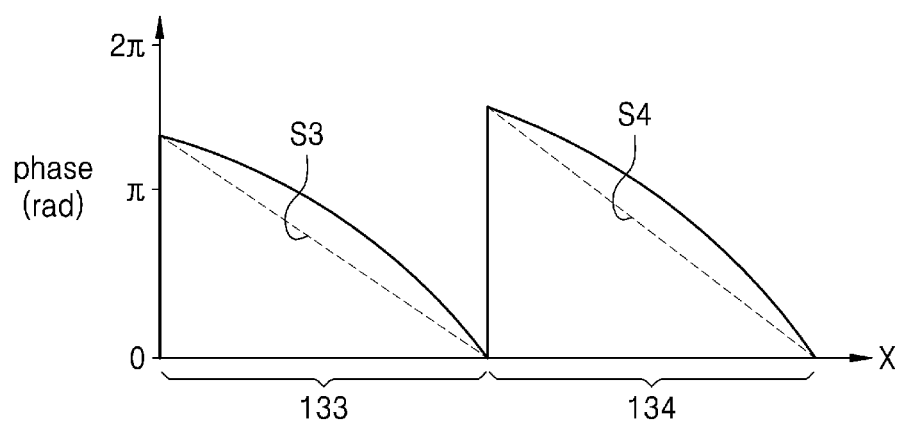

Also, FIGS. 13A and 13B show examples of phase profiles of light immediately after passing through the planar nano-photonic microlens array 130 at the right edge 1100*c* of the pixel array 1100 of the optical sensor 1000, according to the embodiment. In particular, FIG. 13A shows the phase profile of the light immediately after passing through the first planar nano-photonic microlens 131 and the second planar nano-photonic microlens 132 in the first direction taken along line A3-A3' of FIG. 12, and FIG. 13B shows the phase profile of the light immediately after passing through the third planar nano-photonic microlens 133 and the fourth planar nano-photonic microlens 134 in the first direction taken along line A4-A4' of FIG. 12.

Referring to FIGS. 13A and 13B, the phase profile of the light immediately after passing through each of the first to fourth planar nano-photonic microlenses 131, 132, 133, and 134 in the first direction at the right edge 1100*c* of the pixel array 1100 may have a shape inverted in the first direction from the phase profile of the light immediately after passing through each of the first to fourth planar nano-photonic microlenses 131, 132, 133, and 134 in the first direction at the left edge 1100*b* of the pixel array 1100. Therefore, in each of the first to fourth planar nano-photonic microlenses 131, 132, 133, and 134, the slopes of the first to fourth linear phase profiles S1, S2, S3, and S4 in the first direction may be provided in a direction of increasing a phase delay toward the center portion 1100*a* of the pixel array 1100. For example, the slopes of the first to fourth linear phase profiles S1, S2, S3, and S4 in the first direction may have the direction in which the phase delay increases toward the right side at the left edge of the pixel array 1100 and the phase delay increases toward the left side at the right edge of the pixel array 1100.

To do this, as shown in FIGS. 9 and 12, the diameters of the nano-structures NP in each of the first to fourth planar nano-photonic microlenses 131, 132, 133, and 134 are generally increased toward the center portion 1100*a* of the pixel array 1100 in the first direction. For example, at the left edge of the pixel array 1100, an average diameter of the nano-structures NP located at a right side of each of the first to fourth planar nano-photonic microlenses 131, 132, 133, and 134 is greater than that of the nano-structures NP located at a left side of each of the first to fourth planar nanophotonic microlenses 131, 132, 133, and 134. At the right edge of the pixel array 1100, an average diameter of the nano-structures NP located at a left side of each of the first to fourth planar nano-photonic microlenses 131, 132, 133, and 134 is greater than that of the nano-structures NP located at a right side of each of the first to fourth planar nano-photonic microlenses 131, 132, 133, and 134.

Although not shown in the drawings, because the CRA in the second direction is 0° at the right edge 1100c of the pixel array 1100, the first to fourth planar nano-photonic microlenses 131, 132, 133, and 134 may be configured to implement the phase profile formed as the convex curve that is symmetrical in the second direction. To this end, as shown in FIG. 12, the diameters of the nano-structures NP located at the center portion in each of the first to fourth planar nano-photonic microlenses 131, 132, 133, and 134 in the second direction may be greater than those of the nano-structures NP located at the edges in the second direction. Other elements of the first to fourth planar nano-photonic microlenses 131, 132, 133, and 134 arranged at the right edge 1100c of the pixel array 1100 are the same as those of above description, and thus, redundant descriptions will be omitted.

So far, the structures and functions of the first to fourth planar nano-photonic microlenses 131, 132, 133, and 134 arranged on the periphery portion of the pixel array 1100 in the first direction are described as above. The structures and functions of the first to fourth planar nano-photonic microlenses 131, 132, 133, and 134 arranged on the periphery portion of the pixel array 1100 in the second direction are only different in directions thereof, and thus, the above descriptions may also apply thereto. For example, the light immediately after passing through each of the first to fourth planar nano-photonic microlenses 131, 132, 133, and 134 arranged on the periphery portion of the pixel array 1100 in the second direction may have a phase profile in which a linear phase profile inclined in the second direction and a convex phase profile are added, and may have a phase profile having the symmetrical convex curve shape in the first direction. Also, the light immediately after passing through each of the first to fourth planar nano-photonic microlenses 131, 132, 133, and 134 arranged on the periphery portion of the pixel array 1100 in a diagonal direction may have a phase profile, in which a linear phase profile inclined in both the first and second directions and the convex phase profile are added.

Figure 14A:
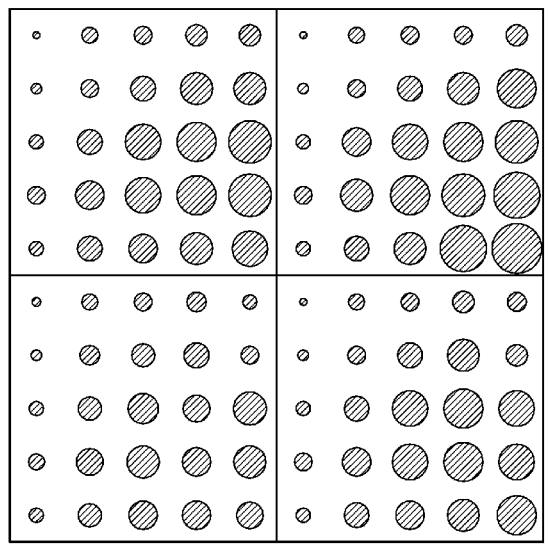
FIGS. 14A to 14F are plan views showing examples of nano-pattern structures at different positions of a planar nano-photonic microlens array of an optical sensor according to an example embodiment.
Figure 14A:
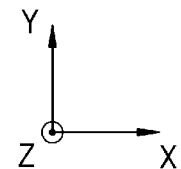
Figure 14B:
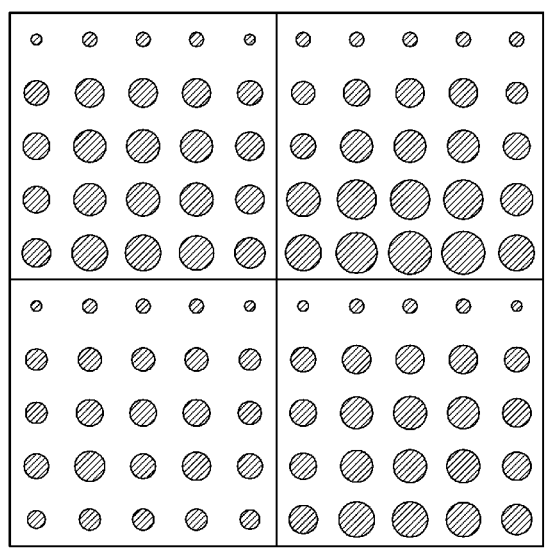
Figure 14B:
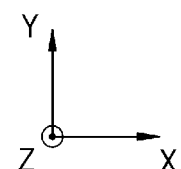
Figure 14C:
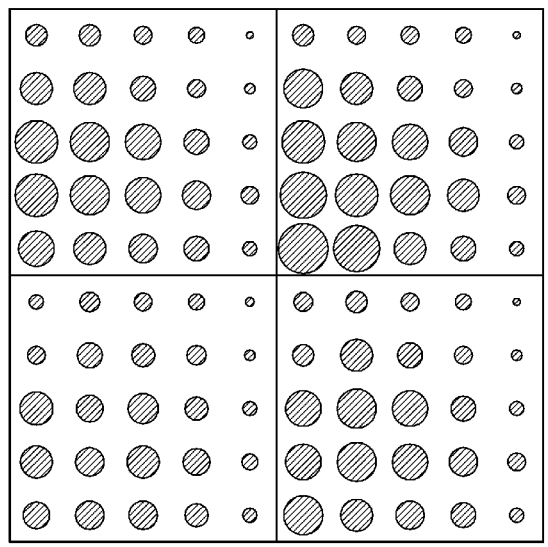
Figure 14C:
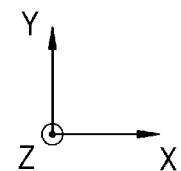
Figure 14D:
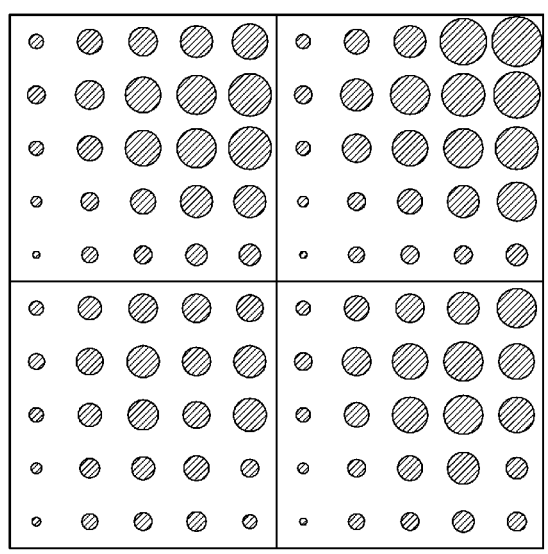
Figure 14D:
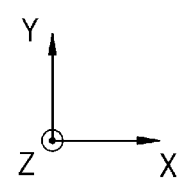
Figure 14E:
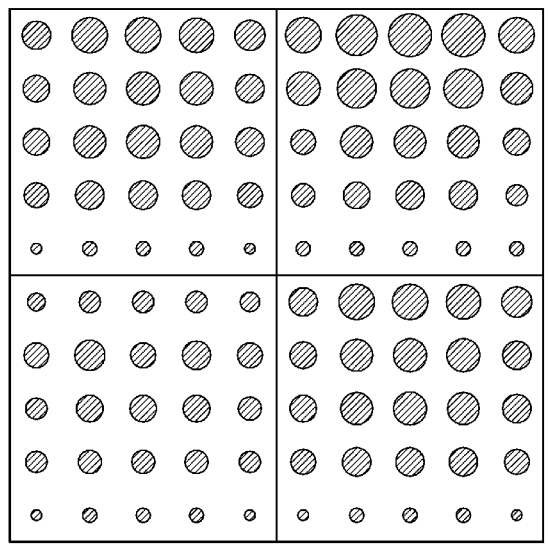
Figure 14E:
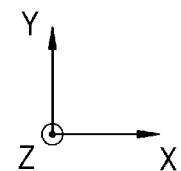
Figure 14F:
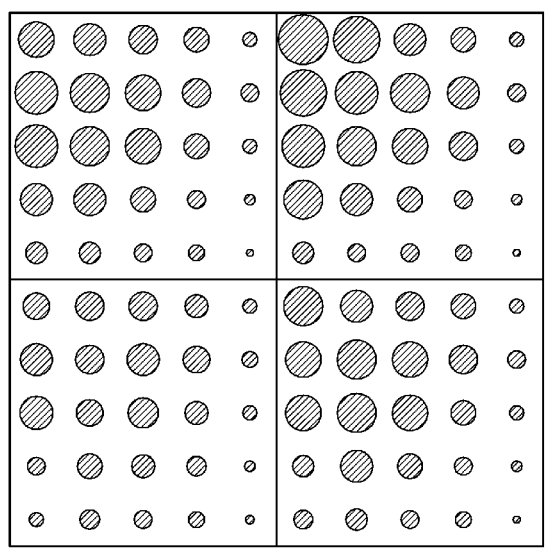
Figure 14F:
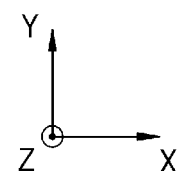

FIGS. 14A to 14F are plan views showing examples of nano-pattern structures at different positions of the planar nano-photonic microlens array 130 of the optical sensor 1000 according to an example embodiment. For example, the nano-pattern structures of the planar nano-photonic microlens array 130 at an upper left vertex, an upper edge, an upper right vertex, a lower left vertex, a lower edge, and a lower right vertex are respectively shown in FIGS. 14A, 14B, 14C, 14D, 14E, and 14F. Referring to FIG. 14A, at the upper left vertex, an average diameter of the nano-structures NP arranged on a lower right vertex region in each of the first to fourth planar nano-photonic microlenses 131, 132, 133, and 134 is relatively large. Referring to FIG. 14B, at the upper edge, an average diameter of the nano-structures NP arranged on a lower region in each of the first to fourth planar nano-photonic microlenses 131, 132, 133, and 134 is relatively large. Referring to FIG. 14C, at the upper right vertex, an average diameter of the nano-structures NP arranged on a lower left vertex region in each of the first to fourth planar nano-photonic microlenses 131, 132, 133, and 134 is relatively large. Referring to FIG. 14D, at the lower left vertex, an average diameter of the nano-structures NP arranged on an upper right vertex region in each of the first to fourth planar nano-photonic microlenses 131, 132, 133, and 134 is relatively large. Referring to FIG. 14E, at the lower edge, an average diameter of the nano-structures NP arranged on an upper region in each of the first to fourth planar nano-photonic microlenses 131, 132, 133, and 134 is relatively large. Referring to FIG. 14F, at the lower right vertex, an average diameter of the nano-structures NP arranged on an upper left vertex region in each of the first to fourth planar nano-photonic microlenses 131, 132, 133, and 134 is relatively large.

As described above, in the planar nano-photonic microlens array 130 according to the embodiment, the incident angle of the incident light that is incident on the edge of the optical sensor 1000 at a large CRA may be changed nearly to the vertical angle. In particular, the planar nano-photonic microlens array 130 may include the planar nano-photonic microlenses 131, 132, 133, and 134 of various shapes, in consideration of the variation in the CRA according to various locations on the optical sensor 1000. Therefore, the sensitivity of the pixels located at the edges of the optical sensor 1000 may be improved to be similar to that of the pixels located on the center portion of the optical sensor 1000.

Also, according to the embodiment, the locations of the filter and the microlens may not be shifted with respect to the corresponding pixel in consideration of the CRA. For example, as shown in FIGS. 5A, 5B, 8A, 8B, 11A, and 11B, boundaries among the planar nano-photonic microlenses 131, 132, 133, and 134 may match with boundaries among the filters 121, 122, 123, and 124 and boundaries among the photosensitive cells 111, 112, 113, and 114 in the entire area of the optical sensor 1000 or the pixel array 1100. In other words, in the entire area of the optical sensor 1000 or the pixel array 1100, the photosensitive cells 111, 112, 113, and 114, the planar nano-photonic microlenses 131, 132, 133, and 134, and the filters 121, 122, 123, and 124 may directly face one another in the third direction. Therefore, the optical sensor 1000 may be easily designed and assembled.

However, as necessary, the filters 121, 122, 123, and 124 and the planar nano-photonic microlenses 131, 132, 133, and 134 may be shifted with respect to corresponding photosensitive cells 111, 112, 113, and 114. For example, in order to further improve the sensitivity of the optical sensor 1000, the filters 121, 122, 123, and 124 may be shifted with respect to the corresponding photosensitive cells 111, 112, 113, and 114, and the planar nano-photonic microlenses 131, 132, 133, and 134 may be arranged facing the corresponding filters 121, 122, 123, and 124. Otherwise, the filters 121, 122, 123, and 124 may be shifted with respect to the corresponding photosensitive cells 111, 112, 113, and 114, and the planar nano-photonic microlenses 131, 132, 133, and 134 may be also shifted with respect to the corresponding filters 121, 122, 123, and 124.

Figure 15A:
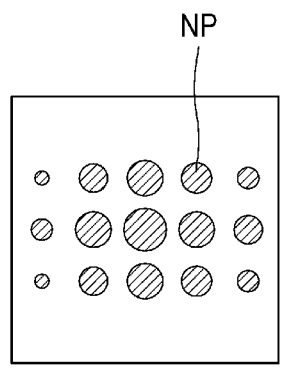
FIGS. 15A to 15F are plan views showing examples of various nano-pattern structures of a planar nano-photonic microlens array according to another example embodiment.
Figure 15B:
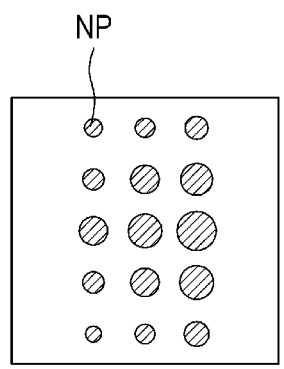
Figure 15C:
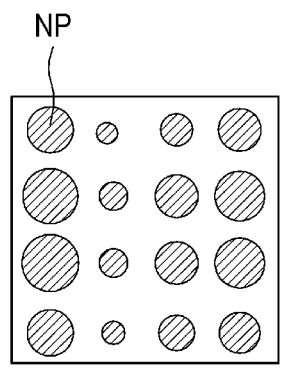
Figure 15D:
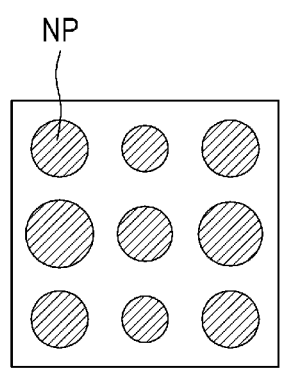
Figure 15E:
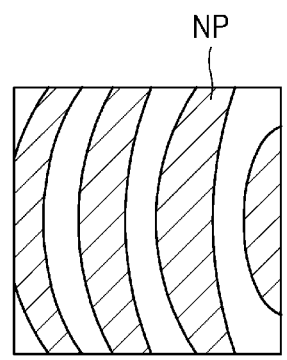
Figure 15F:
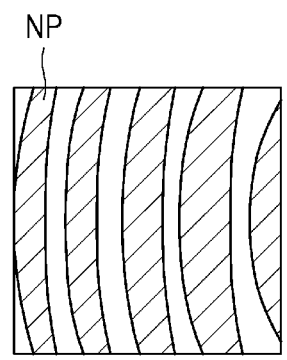

In the above description, the nano-pattern structure in each of the first to fourth planar nano-photonic microlenses 131, 132, 133, and 134 has the nano-structures NP of circular shapes that are two-dimensionally arranged in 5×5 array. However, the nano-pattern structures of the planar nano-photonic microlens array 130 are not limited thereto, and may have other various types. For example, FIGS. 15A to 15F are plan views showing examples of various nano-pattern structures in a planar nano-photonic microlens array according to another example embodiment. As shown in FIGS. 15A to 15D, the nano-pattern structure may include the nano-structures NP that are two-dimensionally arranged in various types, e.g., 3×5, 5×3, 4×4, 3×3, etc. Also, as shown in FIGS. 15E and 15F, the nano-pattern structure may have nano-lattice shapes that are one-dimensionally arranged. In each of the first to fourth planar nano-photonic microlenses 131, 132, 133, and 134, an individual nano-structure NP may have a curved shape extending in the first or second direction, and the phase profile of the transmitted light may be determined according to curvatures, widths, and intervals of the nano-structures NP. In addition, although not shown in the drawings, the nano-structures may be nano-posts having polygonal, e.g., rectangular, or elliptical cross-sections, as well as the circular shape.

Figure 16:
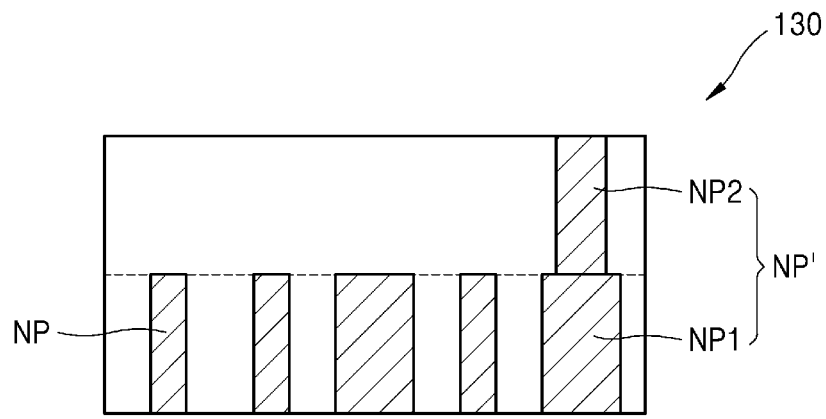
FIG. 16 is a cross-sectional view showing an example of a planar nano-photonic microlens array according to another example embodiment.

FIG. 16 is a cross-sectional view showing an example of a planar nano-photonic microlens array 130 according to another example embodiment. Referring to FIG. 16, the planar nano-photonic microlens array 130 may have a multi-layered structure. For example, the planar nano-photonic microlens array 130 may include nano-structures NP' having multi-layered structures, each including a first nano-structure NP1 and a second nano-structure NP2 on the first nano-structure NP1. In addition, the planar nano-photonic microlens array 130 may further include the nano-structures NP having the single-layered structures, in addition to the nano-structures NP' of the multi-layered structures. The nano-structure NP' having the multi-layered structure may be provided in order to achieve a large phase delay with a small cross-sectional area. For example, when it is difficult to arrange the nano-structures NP having large diameters because each of the planar nano-photonic microlenses 131, 132, 133, and 134 has a small area, the nano-structures NP' of the multi-layered structures may be arranged.

Figure 17:
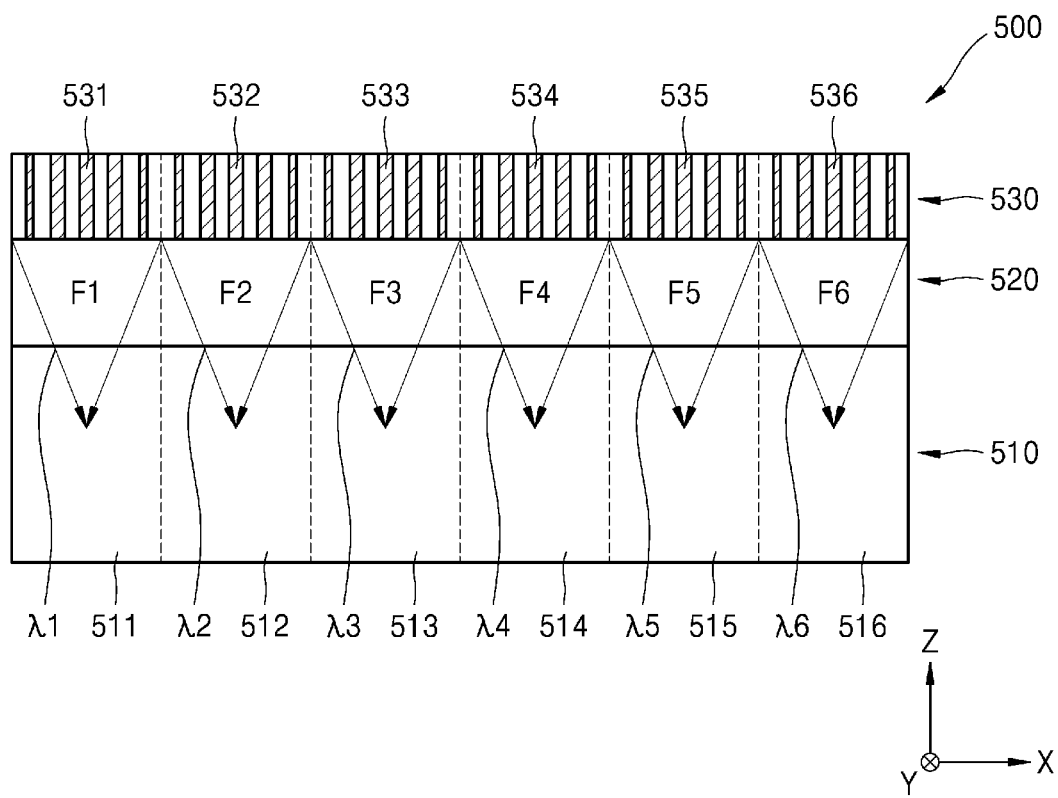
FIG. 17 is a cross-sectional view showing an example of a pixel array of an optical sensor according to another example embodiment.

In the above description, the optical sensor 1000 is described as an image sensor applied to a camera, etc., but the optical sensor 1000 may be applied to other various optical fields such as a spectroscopy sensor in a spectrometer. For example, FIG. 17 is a cross-sectional view showing an example of a pixel array 500 in an optical sensor according to another example embodiment. Referring to FIG. 17, the pixel array 500 may include a sensor substrate 510, a filter layer 520 on the sensor substrate 510, and a planar nano-photonic microlens array 530 on the filter layer 520. The sensor substrate 510 may include a plurality of photosensitive cells 511, 512, 513, 514, 515, and 516 sensing light of at least four different wavelength bands $\lambda 1$, $\lambda 2$, $\lambda 3$, $\lambda 4$, $\lambda 5$, and $\lambda 6$ from one another. The filter layer 520 may include a plurality of bandpass filters F1, F2, F3, F4, F5, and F6 that respectively pass the light of different wavelength bands $\lambda 1$, $\lambda 2$, $\lambda 3$, $\lambda 4$, $\lambda 5$, and $\lambda 6$. In addition, the planar nano-photonic microlens array 530 may include a plurality of planar nano-photonic microlenses 531, 532, 533, 534, 535, and 536 for condensing light of the different wavelength bands $\lambda 1$, $\lambda 2$, $\lambda 3$, $\lambda 4$, $\lambda 5$, and $\lambda 6$ on corresponding photosensitive cells. The plurality of planar nano-photonic microlenses 531, 532, 533, 534, 535, and 536 may be configured to deviate the incident light toward the centers of the corresponding photosensitive cells according to the CRAs.

The optical sensor 1000 may be employed in various high-performance optical devices or high-performance electronic apparatuses. The electronic apparatuses may include, for example, smartphones, personal digital assistants (PDAs), laptop computers, personal computers (PCs), a variety of portable devices, electronic apparatuses, surveillance cameras, medical cameras, automobiles, Internet of Things (IoT) devices, other mobile or non-mobile computing devices and are not limited thereto.

The electronic apparatuses may further include, in addition to the optical sensor 1000, a processor for controlling the optical sensor, for example, an application processor (AP), and may control a plurality of hardware or software elements and may perform various data processes and operations by driving an operating system or application programs via the processor. The processor may further include a graphic processing unit (GPU) and/or an image signal processor. When an image signal processor is included in the processor, an image (or video) obtained by the optical sensor may be stored and/or output by using the processor.

Figure 18:
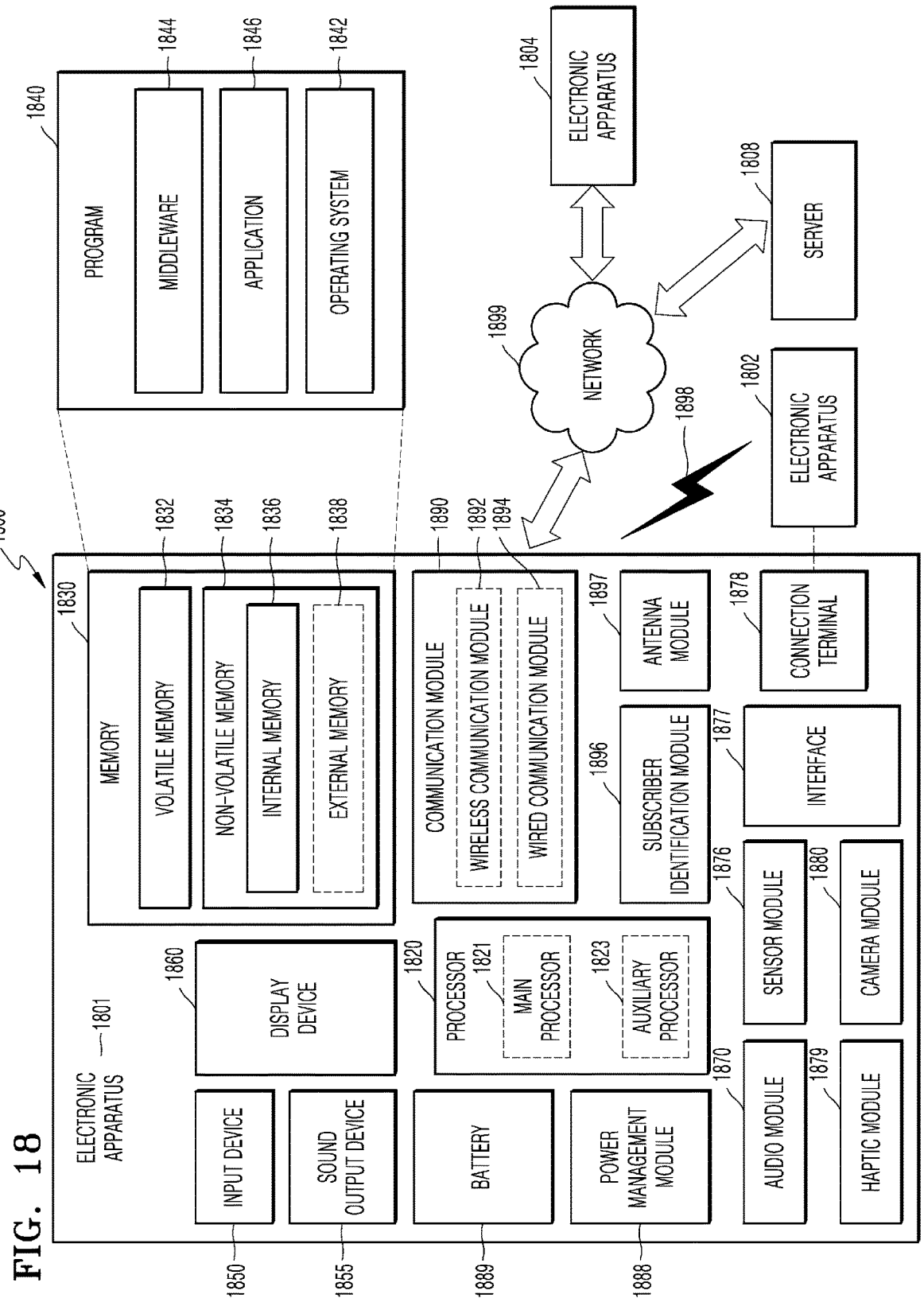
FIG. 18 is a block diagram of an electronic device including an image sensor according to one or more embodiments.

FIG. 18 is a block diagram showing an example of an electronic apparatus 1801 including the optical sensor 1000. Referring to FIG. 18, in a network environment 1800, the electronic apparatus 1801 may communicate with another electronic apparatus 1802 via a first network 1898 (short-range wireless communication network, etc.), or may communicate with another electronic apparatus 1804 and/or a server 1808 via a second network 1899 (long-range wireless communication network, etc.) The electronic apparatus 1801 may communicate with the electronic apparatus 1804 via the server 1808. The electronic apparatus 1801 may include a processor 1820, a memory 1830, an input device 1850, a sound output device 1855, a display device 1860, an audio module 1870, a sensor module 1876, an interface 1877, a haptic module 1879, a camera module 1880, a power management module 1888, a battery 1889, a communication module 1890, a subscriber identification module 1896, and/or an antenna module 1897. In the electronic apparatus 1801, some (display device 1860, etc.) of the elements may be omitted or another element may be added. Some of the elements may be configured as one integrated circuit. For example, the sensor module 1876 (a fingerprint sensor, an iris sensor, an illuminance sensor, etc.) may be embedded and implemented in the display device 1860 (display, etc.)

The processor 1820 may control one or more elements (hardware, software elements, etc.) of the electronic apparatus 1801 connected to the processor 1820 by executing software (program 1840, etc.), and may perform various data processes or operations. As a part of the data processing or operations, the processor 1820 may load a command and/or data received from another element (sensor module 1876, communication module 1890, etc.) to a volatile memory 1832, may process the command and/or data stored in the volatile memory 1832, and may store result data in a non-volatile memory 1834. The processor 1820 may include a main processor 1821 (central processing unit, application processor, etc.) and an auxiliary processor 1823 (graphic processing unit, image signal processor, sensor hub processor, communication processor, etc.) that may be operated independently from or along with the main processor 1821. The auxiliary processor 1823 may use less power than that of the main processor 1821, and may perform specified functions.

The auxiliary processor 1823, on behalf of the main processor 1821 while the main processor 1821 is in an inactive state (sleep state) or along with the main processor 1821 while the main processor 1821 is in an active state (application executed state), may control functions and/or states related to some (display device 1860, sensor module 1876, communication module 1890, etc.) of the elements in the electronic apparatus 1801. The auxiliary processor 1823 (image signal processor, communication processor, etc.) may be implemented as a part of another element (camera module 1880, communication module 1890, etc.) that is functionally related thereto.

The memory 1830 may store various data required by the elements (processor 1820, sensor module 1876, etc.) of the electronic apparatus 1801. The data may include, for example, input data and/or output data about software (program 1840, etc.) and commands related thereto. The memory 1830 may include the volatile memory 1832 and/or the non-volatile memory 1834.

The program 1840 may be stored as software in the memory 1830, and may include an operating system 1842, middleware 1844, and/or an application 1846.

The input device 1850 may receive commands and/or data to be used in the elements (processor 1820, etc.) of the electronic apparatus 1801, from outside (user, etc.) of the electronic apparatus 1801. The input device 1850 may include a microphone, a mouse, a keyboard, and/or a digital pen (stylus pen).

The sound output device 1855 may output a sound signal to outside of the electronic apparatus 1801. The sound output device 1855 may include a speaker and/or a receiver. The speaker may be used for a general purpose such as multimedia reproduction or record play, and the receiver may be used to receive a call. The receiver may be coupled as a part of the speaker or may be implemented as an independent device.

The display device 1860 may provide visual information to outside of the electronic apparatus 1801. The display device 1860 may include a display, a hologram device, or a projector, and a control circuit for controlling the corresponding device. The display device 1860 may include a touch circuitry set to sense a touch, and/or a sensor circuit (pressure sensor, etc.) that is set to measure a strength of a force generated by the touch.

The audio module 1870 may convert sound into an electrical signal or vice versa. The audio module 1870 may acquire sound through the input device 1850, or may output sound via the sound output device 1855 and/or a speaker and/or a headphone of another electronic apparatus (electronic apparatus 1802, etc.) connected directly or wirelessly to the electronic apparatus 1801.

The sensor module 1876 may sense an operating state (power, temperature, etc.) of the electronic apparatus 1801, or an outer environmental state (user state, etc.), and may generate an electrical signal and/or data value corresponding to the sensed state. The sensor module 1876 may include a gesture sensor, a gyro-sensor, a pressure sensor, a magnetic sensor, an acceleration sensor, a grip sensor, a proximity sensor, a color sensor, an infrared (IR) ray sensor, a vivo sensor, a temperature sensor, a humidity sensor, and/or an illuminance sensor.

The interface 1877 may support one or more designated protocols that may be used in order for the electronic apparatus 1801 to be directly or wirelessly connected to another electronic apparatus (electronic apparatus 1802, etc.) The interface 1877 may include a high-definition multimedia interface (HDMI), a universal serial bus (USB) interface, an SD card interface, and/or an audio interface.

The connection terminal 1878 may include a connector by which the electronic apparatus 1801 may be physically connected to another electronic apparatus (electronic apparatus 1802, etc.). The connection terminal 1878 may include an HDMI connector, a USB connector, an SD card connector, and/or an audio connector (headphone connector, etc.).

The haptic module 1879 may convert the electrical signal into a mechanical stimulation (vibration, motion, etc.) or an electrical stimulation that the user may sense through a tactile or motion sensation. The haptic module 1879 may include a motor, a piezoelectric device, and/or an electric stimulus device.

The camera module 1880 may capture a still image and a video. The camera module 1880 may include a lens assembly including one or more lenses, the optical sensor 1000 of FIG. 1, image signal processors, and/or flashes. The lens assembly included in the camera module 1880 may collect light emitted from an object that is to be captured.

The power management module 1888 may manage the power supplied to the electronic apparatus 1801. The power management module 1888 may be implemented as a part of a power management integrated circuit (PMIC).

The battery 1889 may supply electric power to components of the electronic apparatus 1801. The battery 1889 may include a primary battery that is not rechargeable, a secondary battery that is rechargeable, and/or a fuel cell.

The communication module 1890 may support the establishment of a direct (wired) communication channel and/or a wireless communication channel between the electronic apparatus 1801 and another electronic apparatus (electronic apparatus 1802, electronic apparatus 1804, server 1808, etc.), and execution of communication through the established communication channel. The communication module 1890 may be operated independently from the processor 1820 (application processor, etc.), and may include one or more communication processors that support the direct communication and/or the wireless communication. The communication module 1890 may include a wireless communication module 1892 (cellular communication module, a short-range wireless communication module, a global navigation satellite system (GNSS) communication module) and/or a wired communication module 1894 (local area network (LAN) communication module, a power line communication module, etc.). From among the communication modules, a corresponding communication module may communicate with another electronic apparatus via a first network 1898 (short-range communication network such as Bluetooth, WiFi direct, or infrared data association (IrDA)) or a second network 1899 (long-range communication network such as a cellular network, Internet, or computer network (LAN, WAN, etc.)). Such above various kinds of communication modules may be integrated as one element (single chip, etc.) or may be implemented as a plurality of elements (a plurality of chips) separately from one another. The wireless communication module 1892 may identify and authenticate the electronic apparatus 1801 in a communication network such as the first network 1898 and/or the second network 1899 by using subscriber information (international mobile subscriber identifier (IMSI), etc.) stored in the subscriber identification module 1896.

The antenna module 1897 may transmit or receive the signal and/or power to/from outside (another electronic apparatus, etc.). An antenna may include a radiator formed as a conductive pattern formed on a substrate (PCB, etc.). The antenna module 1897 may include one or more antennas. When the antenna module 1897 includes a plurality of antennas, from among the plurality of antennas, an antenna that is suitable for the communication type used in the communication network such as the first network 1898 and/or the second network 1899 may be selected by the communication module 1890. The signal and/or the power may be transmitted between the communication module 1890 and another electronic apparatus via the selected antenna. Another component (RFIC, etc.) other than the antenna may be included as a part of the antenna module 1897.

Some of the elements may be connected to one another via the communication method among the peripheral devices (bus, general purpose input and output (GPIO), serial peripheral interface (SPI), mobile industry processor interface (MIPI), etc.) and may exchange signals (commands, data, etc.).

The command or data may be transmitted or received between the electronic apparatus 1801 and the external electronic apparatus 1804 via the server 1808 connected to the second network 1899. Other electronic apparatuses 1802 and 1804 may be the devices that are the same as or different kinds from the electronic apparatus 1801. All or some of the operations executed in the electronic apparatus 1801 may be executed in one or more devices among the other electronic apparatuses 1802, 1804, and 1808. For example, when the electronic apparatus 1801 has to perform a certain function or service, the electronic apparatus 1801 may request one or more other electronic apparatuses to perform some or entire function or service, instead of executing the function or service by itself. One or more electronic apparatuses receiving the request execute an additional function or service related to the request and may transfer a result of the execution to the electronic apparatus 1801. To do this, for example, a cloud computing, a distributed computing, or a client-server computing technique may be used.

Figure 19:
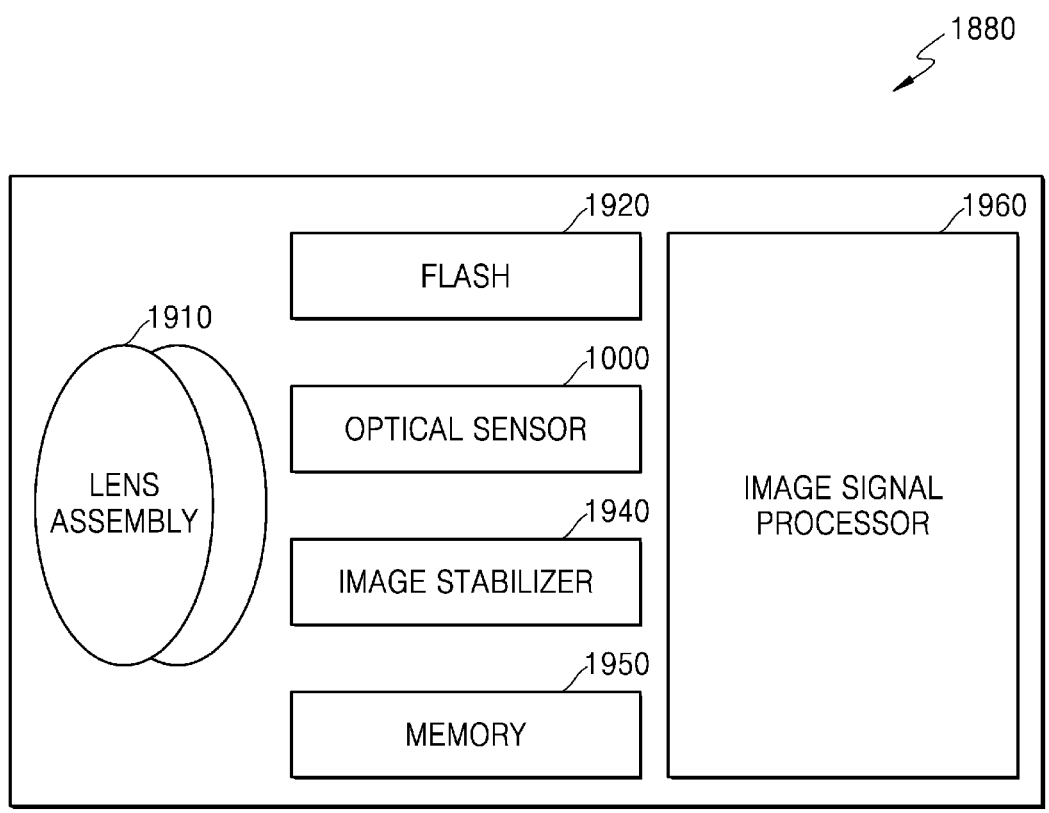
FIG. 19 is a block diagram of a camera module of FIG. 18.

FIG. 19 is a block diagram showing the camera module 1880 of FIG. 18. Referring to FIG. 19, the camera module 1880 may include a lens assembly 1910, a flash 1920, an optical sensor 1000 (the optical sensor 1000 of FIG. 1), an image stabilizer 1940, a memory 1950 (buffer memory, etc.), and/or an image signal processor 1960. The lens assembly 1910 may collect light emitted from an object that is to be captured. The camera module 1880 may include a plurality of lens assemblies 1910, and in this case, the camera module 1880 may include a dual camera module, a 360-degree camera, or a spherical camera. Some of the plurality of lens assemblies 1910 may have the same lens properties (viewing angle, focal distance, auto-focus, F number, optical zoom, etc.) or different lens properties. The lens assembly 1910 may include a wide-angle lens or a telephoto lens.

The flash 1920 may emit light that is used to strengthen the light emitted or reflected from the object. The flash 1920 may include one or more light-emitting diodes (red-green-blue (RGB) LED, white LED, infrared LED, ultraviolet LED, etc.), and/or a Xenon lamp. The optical sensor 1000 may be the optical sensor described above with reference to FIG. 1, and converts the light emitted or reflected from the object and transferred through the lens assembly 1910 into an electrical signal to obtain an image corresponding to the object. The optical sensor 1000 may include one or more selected sensors from among optical sensors having different properties such as an RGB sensor, a black-and-white (BW) sensor, an IR sensor, and a UV sensor. Each of the sensors included in the optical sensor 1000 may be implemented as a charge coupled device (CCD) sensor and/or a complementary metal oxide semiconductor (CMOS) sensor.

The image stabilizer 1940, in response to a motion of the camera module 1880 or the electronic apparatus 1901 including the camera module 1880, moves one or more lenses included in the lens assembly 1910 or the optical sensor 1000 in a certain direction or controls the operating characteristics of the optical sensor 1000 (adjusting of a read-out timing, etc.) in order to compensate for a negative influence of the motion. The image stabilizer 1940 may sense the movement of the camera module 1880 or the electronic apparatus 1801 by using a gyro sensor (not shown) or an acceleration sensor (not shown) disposed in or out of the camera module 1880. The image stabilizer 1940 may be implemented as an optical type.

The memory 1950 may store some or entire data of the image obtained through the optical sensor 1000 for next image processing operation. For example, when a plurality of images are obtained at a high speed, obtained original data (Bayer-patterned data, high resolution data, etc.) is stored in the memory 1950, and a low resolution image is only displayed. Then, original data of a selected image (user selection, etc.) may be transferred to the image signal processor 1960. The memory 1950 may be integrated with the memory 1830 of the electronic apparatus 1801, or may include an additional memory that is operated independently.

The image signal processor 1960 may perform image treatment on the image obtained through the optical sensor 1000 or the image data stored in the memory 1950. The image treatments may include a depth map generation, a three-dimensional modeling, a panorama generation, extraction of features, an image combination, and/or an image compensation (noise reduction, resolution adjustment, brightness adjustment, blurring, sharpening, softening, etc.). The image signal processor 1960 may perform controlling (exposure time control, read-out timing control, etc.) of the elements (optical sensor 1000, etc.) included in the camera module 1880. The image processed by the image signal processor 1960 may be stored again in the memory 1950 for additional process, or may be provided to an external element of the camera module 1880 (e.g., the memory 1830, the display device 1860, the electronic apparatus 1802, the electronic apparatus 1804, the server 1808, etc.). The image signal processor 1960 may be integrated with the processor 1820, or may be configured as an additional processor that is independently operated from the processor 1820. When the image signal processor 1960 is configured as an additional processor separately from the processor 1820, the image processed by the image signal processor 1960 undergoes through an additional image treatment by the processor 1820 and then may be displayed on the display device 1860.

The electronic apparatus 1801 may include a plurality of camera modules 1880 having different properties or functions. In this case, one of the plurality of camera modules 1880 may include a wide-angle camera and another camera module may include a telephoto camera. Similarly, one of the plurality of camera modules 1880 may include a front camera and another camera module 1880 may include a rear camera.

Figure 20:
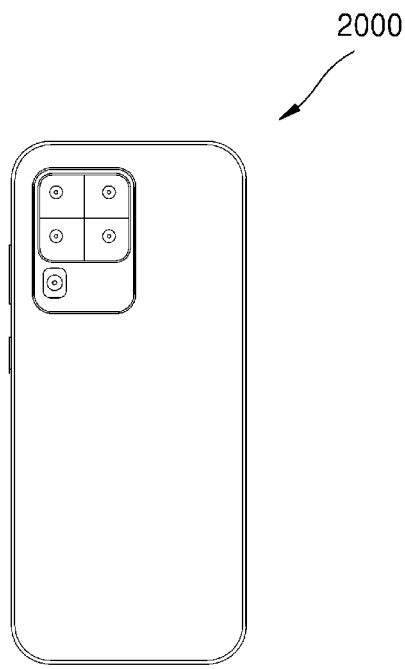
FIGS. 20 to 29 are diagrams showing various examples of an electronic device including an image sensor according to one or more embodiments.
Figure 21:
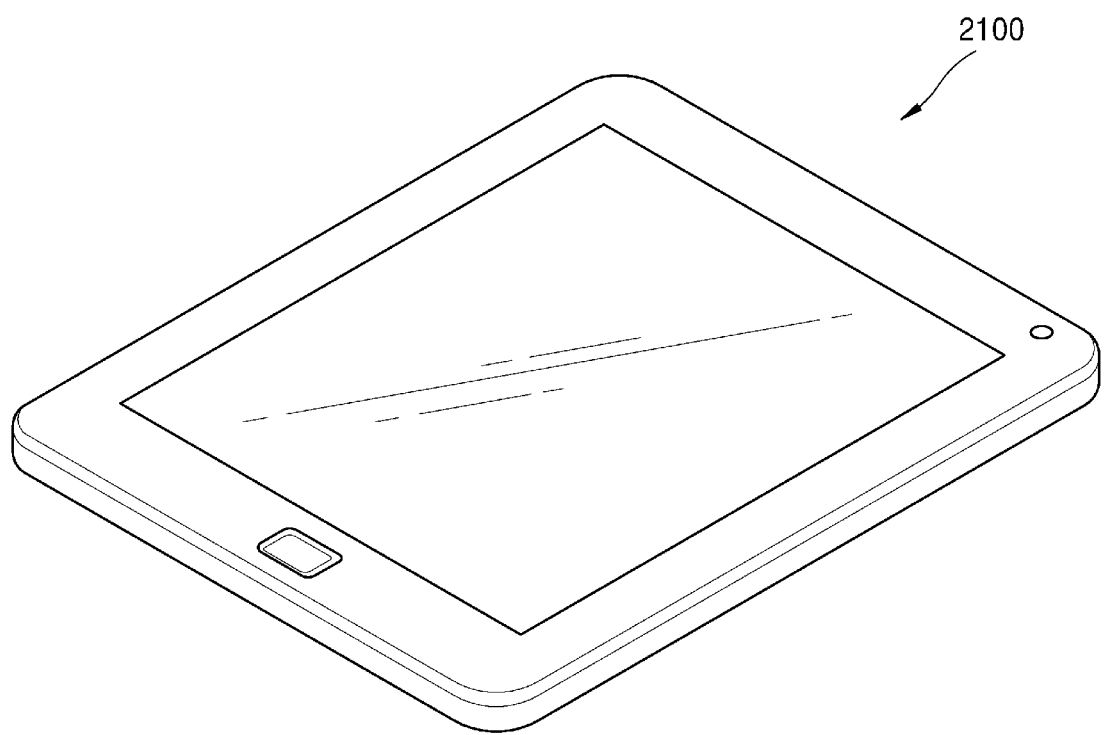
Figure 22:
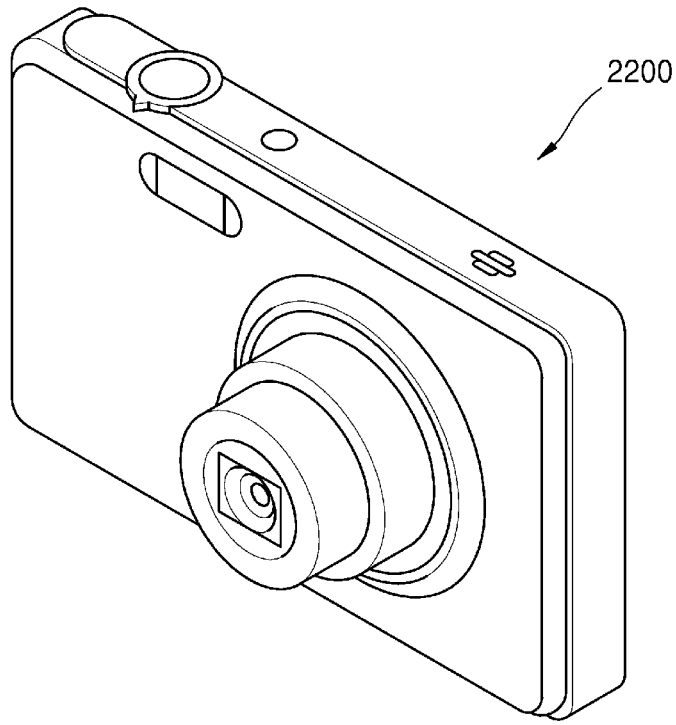
Figure 23:
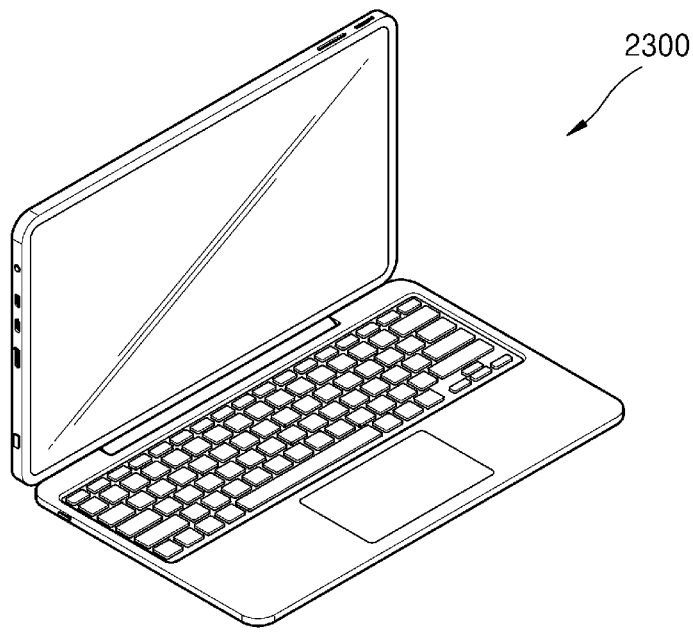
Figure 24:
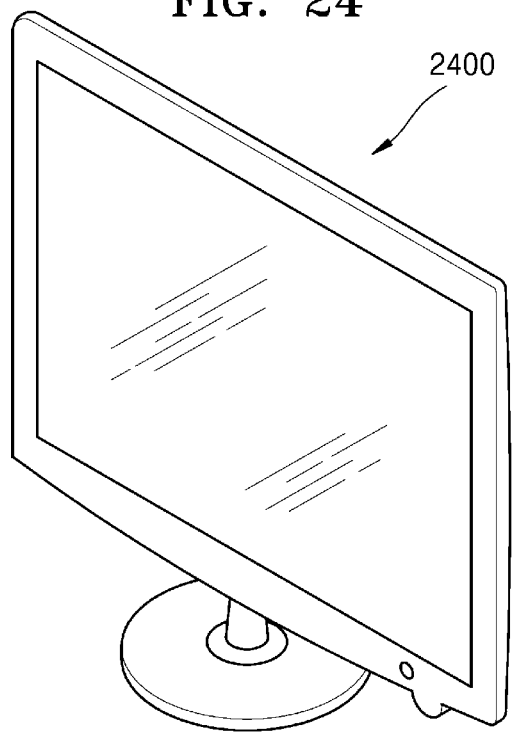

The optical sensor 1000 according to the embodiments may be applied to a mobile phone or a smartphone 2000 shown in FIG. 20, a tablet or a smart tablet 2100 shown in FIG. 21, a digital camera or a camcorder 2200 shown in FIG. 22, a laptop computer 2300 shown in FIG. 23, or a television or a smart television 2400 shown in FIG. 24. For example, the smartphone 2000 or the smart tablet 2100 may include a plurality of high-resolution cameras each including a high-resolution image sensor. Depth information of objects in an image may be extracted, out focusing of the image may be adjusted, or objects in the image may be automatically identified by using the high-resolution cameras.

Figure 25:
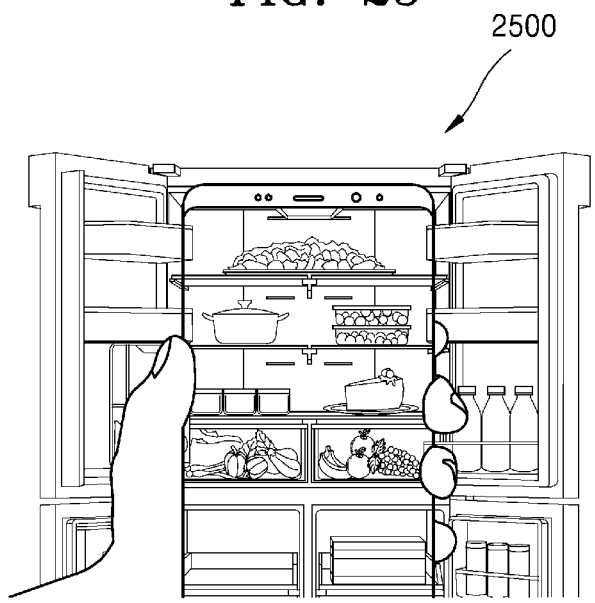
Figure 26:
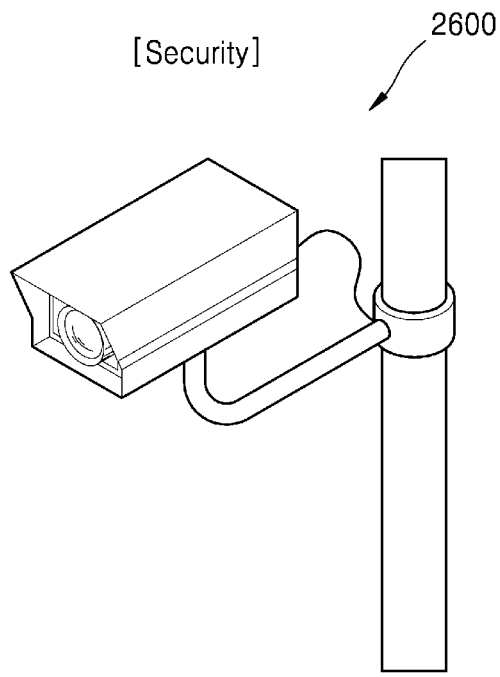
Figure 27:
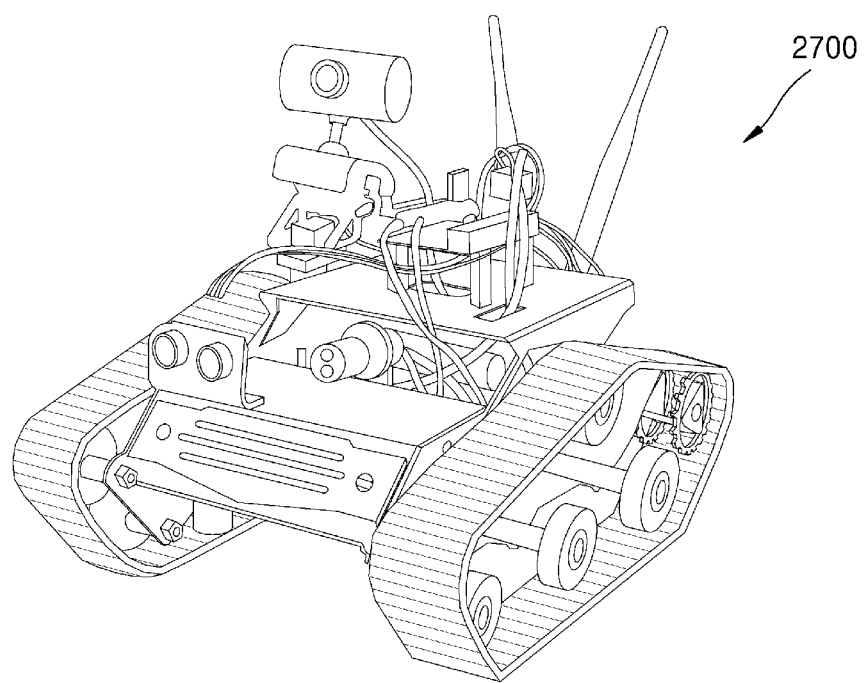
Figure 28:
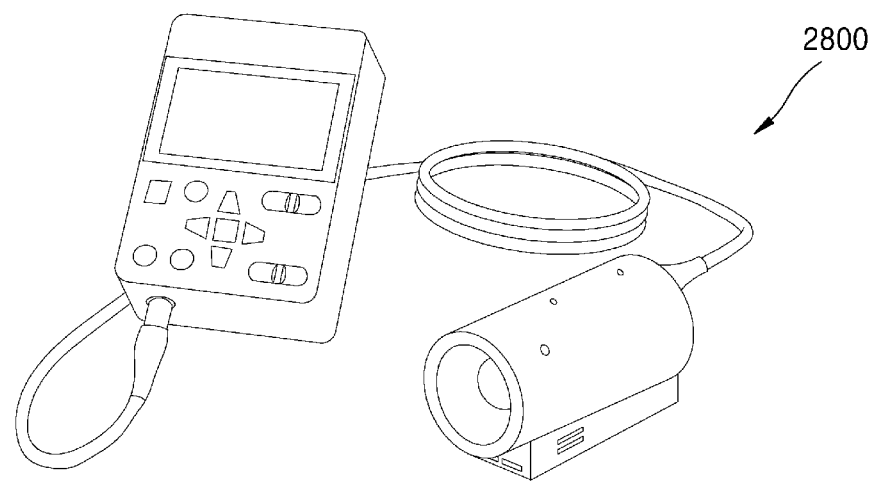

Also, the optical sensor 1000 may be applied to a smart refrigerator 2500 shown in FIG. 25, a surveillance camera 2600 shown in FIG. 26, a robot 2700 shown in FIG. 27, a medical camera 2800 shown in FIG. 28, etc. For example, the smart refrigerator 2500 may automatically recognize food in the refrigerator by using the image sensor, and may notify the user of an existence of a certain kind of food, kinds of food put into or taken out, etc. through a smartphone. Also, the surveillance camera 2600 may provide an ultra-high-resolution image and may allow the user to recognize an object or a person in the image even in a dark environment by using high sensitivity. The robot 2700 may be input to a disaster or industrial site that a person may not directly access, to provide the user with high-resolution images. The medical camera 2800 may provide high-resolution images for diagnosis or surgery, and may dynamically adjust a field of view.

Figure 29:
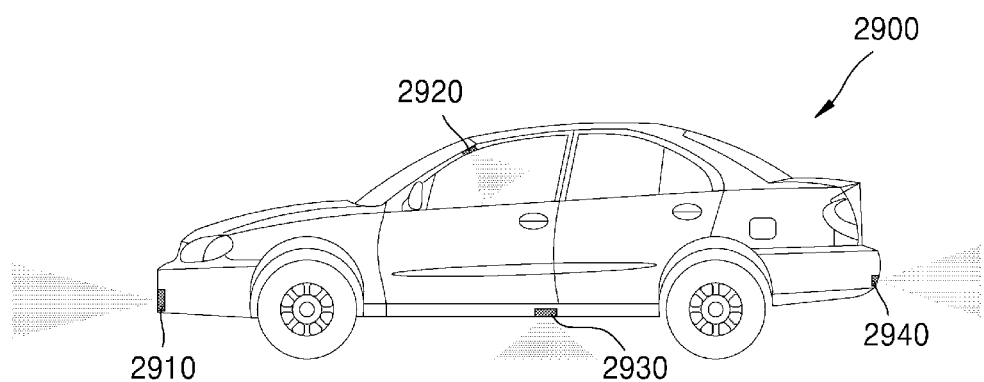

Also, the optical sensor 1000 may be applied to a vehicle 2900 as shown in FIG. 29. The vehicle 2900 may include a plurality of vehicle cameras 2910, 2920, 2930, and 2940 at various locations. Each of the vehicle cameras 2910, 2920, 2930, and 2940 may include the image sensor according to the one or more embodiments. The vehicle 2900 may provide a driver with various information about the interior of the vehicle 2900 or the periphery of the vehicle 2900 by using the plurality of vehicle cameras 2910, 2920, 2930, and 2940, and may provide the driver with the information necessary for the autonomous travel by automatically recognizing an object or a person in the image.

The foregoing exemplary embodiments are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. An optical sensor comprising:
a sensor substrate comprising a plurality of photosensitive cells;
a filter layer provided on the sensor substrate, and comprising a plurality of filters, each of the plurality of filters being configured to selectively transmit light of a certain wavelength band; and
a planar nano-photonic microlens array provided on the filter layer, and comprising a plurality of planar nano-photonic microlenses, each of the plurality of planar nano-photonic microlenses having a nano-pattern structure that condenses the light onto a corresponding photosensitive cell from among the plurality of photosensitive cells,
wherein the plurality of planar nano-photonic microlenses are two-dimensionally arranged in a first direction and a second direction that is perpendicular to the first direction, and
each of the planar nano-photonic microlenses includes a plurality of nano-structures that are arranged such that the light transmitting through each of the planar nano-photonic microlenses has a phase profile in which a phase change curve is convex in the first direction and the second direction,
wherein the phase profile of the light that has passed through a center portion of the planar nano-photonic microlens array has a symmetrical shape in the first direction and a symmetrical shape in the second direction.

2. The optical sensor of claim 1,
wherein boundaries among the plurality of planar nano-photonic microlenses match boundaries among the plurality of filters and boundaries among the plurality of photosensitive cells in an entire area of the optical sensor.

3. The optical sensor of claim 1,
wherein the sensor substrate comprises a first photosensitive cell and a second photosensitive cell,
the filter layer comprises a first filter and a second filter, the first filter corresponding to the first photosensitive cell and transmitting the light of a first wavelength band, and the second filter corresponding to the second photosensitive cell and transmitting the light of a second wavelength band that is shorter than the first wavelength band, and
the planar nano-photonic microlens array comprises a first planar nano-photonic microlens and a second planar nano-photonic microlens, the first planar nano-photonic microlens corresponding to the first filter and condensing the light onto the first photosensitive cell, and the second planar nano-photonic microlens corresponding to the second filter and condensing the light onto the second photosensitive cell.

4. The optical sensor of claim 3,
wherein the first photosensitive cell, the first filter, and the first planar nano-photonic microlens are arranged to face one another in a third direction that is perpendicular to the first direction and the second direction, and
the second photosensitive cell, the second filter, and the second planar nano-photonic microlens are arranged to face one another in the third direction.

5. The optical sensor of claim 3,
wherein the first planar nano-photonic microlens is configured such that the light of the first wavelength band passing through the first filter is condensed onto a center portion of the first photosensitive cell, and
the second planar nano-photonic microlens is configured such that the light of the second wavelength band passing through the second filter is condensed onto a center portion of the second photosensitive cell.

6. The optical sensor of claim 5,
wherein a focal distance of the first planar nano-photonic microlens with respect to the light of the first wavelength band is equal to a focal distance of the second planar nano-photonic microlens with respect to the light of the second wavelength band.

7. The optical sensor of claim 6,
wherein the phase change curve of the phase profile of the light of the second wavelength band that has passed through the second planar nano-photonic microlens, has a curvature greater than a curvature of the phase change curve of the phase profile of the light of the first wavelength band that has passed through the first planar nano-photonic microlens.

8. The optical sensor of claim 5,
wherein the phase profile of the light that has passed through the first and second planar nano-photonic microlenses arranged on a periphery portion of the planar nano-photonic microlens array corresponds to a combination of an inclined linear phase profile and a convex phase profile.

9. The optical sensor of claim 8,
wherein a slope in the first direction of the linear phase profile of the light that has passed through the first planar nano-photonic microlens is less than a slope in the first direction of the linear phase profile of the light that has passed through the second planar nano-photonic microlens that is adjacent to the first planar nano-photonic microlens.

10. An optical sensor comprising:
a sensor substrate comprising a plurality of photosensitive cells;
a filter layer provided on the sensor substrate, and comprising a plurality of filters, each of the plurality of filters being configured to selectively transmit light of a certain wavelength band; and a planar nano-photonic microlens array provided on the filter layer, and comprising a plurality of planar nano-photonic microlenses, each of the plurality of planar nano-photonic microlenses having a nano-pattern structure that condenses the light onto a corresponding photosensitive cell from among the plurality of photosensitive cells, wherein the plurality of planar nano-photonic microlenses are two-dimensionally arranged in a first direction and a second direction that is perpendicular to the first direction, and each of the planar nano-photonic microlenses includes a plurality of nano-structures that are arranged such that the light transmitting through each of the planar nano-photonic microlenses has a phase profile in which a phase change curve is convex in the first direction and the second direction, wherein the planar nano-photonic microlens arranged on a periphery portion of the planar nano-photonic microlens array is configured to condense the light onto a center portion of the corresponding photosensitive cell by deviating a proceeding direction of light that is obliquely incident on the planar nano-photonic microlens.

11. The optical sensor of claim 10,
wherein the phase profile of the light that has passed through the planar nano-photonic microlens arranged on the periphery portion of the planar nano-photonic microlens array corresponds to a combination of an inclined linear phase profile and a convex phase profile.

12. The optical sensor of claim 11,
wherein a slope in the first direction of the inclined linear phase profile of the light that has passed through the planar nano-photonic microlens increases as distance of an incident position of the light from the center portion of the planar nano-photonic microlens array increases in the first direction, and
a slope in the second direction of the inclined linear phase profile of the light that has passed through the planar nano-photonic microlens increases as the distance of the incident position of the light from the center portion of the planar nano-photonic microlens array increases in the second direction.

13. The optical sensor of claim 11,
wherein a slope in the first direction of the inclined linear phase profile of the light that has passed through the planar nano-photonic microlens is proportional to a sine value of an incident angle of the light incident on the planar nano-photonic microlens array in the first direction, and
a slope in the second direction of the inclined linear phase profile of the light that has passed through the planar nano-photonic microlens is proportional to a sine value of an incident angle of the light incident on the planar nano-photonic microlens array in the second direction.

14. The optical sensor of claim 11,
wherein a slope of the inclined linear phase profile of the light that has passed through the planar nano-photonic microlens is proportional to a reciprocal number of a wavelength of light that is transmitted through a filter corresponding to the planar nano-photonic microlens, from among the plurality of filters.

15. An optical sensor comprising:
a sensor substrate comprising a plurality of photosensitive cells;
a filter layer provided on the sensor substrate, and comprising a plurality of filters, each of the plurality of filters being configured to selectively transmit light of a certain wavelength band; and
a planar nano-photonic microlens array provided on the filter layer, and comprising a plurality of planar nano-photonic microlenses, each of the plurality of planar nano-photonic microlenses having a nano-pattern structure that condenses the light onto a corresponding photosensitive cell from among the plurality of photosensitive cells,
wherein the plurality of planar nano-photonic microlenses are two-dimensionally arranged in a first direction and a second direction that is perpendicular to the first direction, and
each of the planar nano-photonic microlenses includes a plurality of nano-structures that are arranged such that the light transmitting through each of the planar nano-photonic microlenses has a phase profile in which a phase change curve is convex in the first direction and the second direction,
wherein the plurality of nano-structures in each of the planar nano-photonic microlenses has a higher refractive index than a refractive index of non-nanostructures of the planar nano-photonic microlenses.

16. The optical sensor of claim 15,
wherein the plurality of nano-structures in the planar nano-photonic microlens arranged on a center portion of the planar nano-photonic microlens array are symmetrically arranged in the first direction and the second direction.

17. The optical sensor of claim 15,
wherein the plurality of nano-structures have nano-post shapes or nano-lattice shapes.

18. The optical sensor of claim 15,
wherein each of the plurality of nano-structures comprises a first nano-structure and a second nano-structure provided on the first nano-structure.

* * * * *